United States Patent
Wang et al.

(10) Patent No.: US 10,546,997 B2
(45) Date of Patent: Jan. 28, 2020

(54) MAGNETIC STRUCTURES INCLUDING FEPD

(71) Applicant: Regents of the University of Minnesota, Minneapolis, MN (US)

(72) Inventors: Jian-Ping Wang, Shoreview, MN (US); Delin Zhang, Saint Paul, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 25 days.

(21) Appl. No.: 15/829,134

(22) Filed: Dec. 1, 2017

(65) Prior Publication Data
US 2018/0287052 A1    Oct. 4, 2018

Related U.S. Application Data

(60) Provisional application No. 62/429,362, filed on Dec. 2, 2016.

(51) Int. Cl.
| | |
|---|---|
| G11C 11/16 | (2006.01) |
| H01L 43/10 | (2006.01) |
| H01L 43/04 | (2006.01) |
| H01L 43/08 | (2006.01) |
| G11C 11/18 | (2006.01) |
| H01L 27/22 | (2006.01) |
| H01L 43/06 | (2006.01) |
| H01L 43/14 | (2006.01) |

(52) U.S. Cl.
CPC .......... *H01L 43/10* (2013.01); *G11C 11/161* (2013.01); *G11C 11/18* (2013.01); *H01L 27/222* (2013.01); *H01L 43/04* (2013.01); *H01L 43/06* (2013.01); *H01L 43/08* (2013.01); *H01L 43/14* (2013.01)

(58) Field of Classification Search
CPC .... G11C 11/161; G11C 11/18; G11C 19/0808
See application file for complete search history.

(56) References Cited

U.S. PATENT DOCUMENTS

| | | | | |
|---|---|---|---|---|
| 2011/0064969 A1* | 3/2011 | Chen | ............ | B82Y 25/00 428/800 |
| 2012/0280336 A1* | 11/2012 | Jan | ............ | H01L 43/08 257/421 |
| 2013/0155754 A1* | 6/2013 | Apalkov | ............ | G11C 11/161 365/80 |
| 2014/0145792 A1* | 5/2014 | Wang | ............ | H01F 10/3272 331/94.1 |

(Continued)

OTHER PUBLICATIONS

Lihama et al., "Low precessional damping observed for L10-ordered FePd epitaxial thin films with large perpendicular magnetic anisotropy," Applied Physics Letters, American Institute of Physics, Oct. 10, 2014, 5 pp.

(Continued)

*Primary Examiner* — Hoai V Ho
*Assistant Examiner* — Jay W. Radke
(74) *Attorney, Agent, or Firm* — Shumaker & Sieffert, P.A.

(57) ABSTRACT

Articles including a fixing layer and a free layer including a layer including an FePd alloy. The free layer may include a composite layer including a perpendicular synthetic antiferromagnetic (p-SAF) structure. Techniques for forming and using articles including FePd alloy layers or p-SAF structures. Example articles and techniques may be usable for storage and logic devices.

24 Claims, 26 Drawing Sheets

(56) References Cited

U.S. PATENT DOCUMENTS

| | | | | |
|---|---|---|---|---|
| 2015/0109853 | A1* | 4/2015 | Sato | H01L 43/08 365/158 |
| 2015/0129993 | A1* | 5/2015 | Tang | H01L 43/10 257/421 |
| 2015/0213869 | A1* | 7/2015 | Wu | G11C 11/1693 365/154 |
| 2015/0255135 | A1* | 9/2015 | Tran | G11C 11/161 365/158 |
| 2016/0141333 | A1* | 5/2016 | Bandyopadhyay ... | H01L 27/222 365/158 |

OTHER PUBLICATIONS

Shiota et al., "Induction of coherent magnetization switching in a few atomic layers of FeCo using voltage pulses," Nature Materials, vol. 11, published online Nov. 13, 2011, 5 pp.
Wang et al., "Electric-field-assisted switching in magnetic tunnel junctions," Nature Materials, vol. 11, published online Nov. 13, 2011, 5 pp.
Zhang et al., "Development of Perpendicular Magnetic Tunnel Junctions with FePd free layers for memory and logic applications," Poster submitted to Semiconductor Research Corporation, P089487, Oct. 6, 2016, 1 pp.
Zhang et al., "Enhancement of tunneling magnetoresistance by inserting a diffusion barrier in L10-FePd perpendicular magnetic tunnel junctions," Semiconductor Research Corporation, P089945, Dec. 14, 2016, 17 pp.
"Micron Steers Roadmap Around Memory Scaling Obstacles," accessed from https://www.hpcwire.com/2015/08/27/micron-steers-roadmap-through-memory-scaling-course/ on Aug. 27, 2015, 16 pp.
"High-Density and Low-Power Spin-Transfer-Torque MRAM with Perpendicular MTJs," Toshiba, accessed from https://www.toshiba.co.jp/rdc/rd/fileds/08_e06_e.htm on Mar. 7, 2018, 2 pp.
Kanai et al., "Spintronics: from Basic Research to VLSI Application," AAPPS Bulletin, vol. 25, No. 1, Feb. 2015, 8 pp.
Weisheit et al., "Electric Field-Induced Modification of Magnetism in Thin-Film Ferromagnets," uploaded to ScienceMag.org, 1136629, Jan. 2007, 5 pp.
Shiota et al., "Induction of coherent magnetization switching in a few atomic layers of FeCo using voltage pulses," Nature Materials, published online Nov. 13, 2011, 5 pp.
Duan et al., "Surface Magnetoelectric Effect in Ferromagnetic Metal Films," Physical Review Letters, Sep. 22, 2008, 4 pp.
Chiba et al., "Electrical control of the ferromagnetic phase transition in cobalt at room temperature," Nature Materials Oct. 2, 2011, 4 pp.
Alzate et al., "Voltage-Induced Switching of Nanoscale Magnetic Tunnel Junctions," International Electron Devices Meeting, Dec. 10-13, 2012, 4 pp.
Seki et al., "Coercivity change in an FePt thin layer in a Hall device by voltage application," Applied Physics Letters, published online May 24, 2011, 3 pp.
Matsukura et al., "Control of magnetism by Electric Fields," Nature Nanotechnology, Mar. 5, 2015, 12 pp.
Negulyaev et al., "Electric Field as a Switching Tool for Magnetic States in Atomic-Scale Nanostructures," Physical Review Letters, Jan. 21, 2011, 4 pp.

Niranjan et al., "Electric Field effect on magnetization at the Fe/MgO(001) interface," Applied Physics Letters, published online Jun. 2, 2010, 3 pp.
Yamanouchi et al., "Electric Field-Induced Magnetization Reversal in a Perpendicular-Anisotropy CoFeB—MgO Magnetic Tunnel Junction," Applied Physics Letters, Sep. 2012, 3 pp.
Wang et al., "Electric-field-assisted switching in magnetic tunnel junctions," Nature Materials, Nov. 13, 2011, 5 pp.
Kita et al., "Electric-field-control of magnetic anisotropy of Co0.6Fe0.2B0.2/oxide stacks using reduced voltage," Journal of Applied Physics, published online Aug. 14, 2012, 4 pp.
Ong et al., Electric field control and effect of Pd capping on magnetocrystalline anisotropy in FePd thin films: A first-principles study, Physical Review, published online Mar. 24, 2014, 8 pp.
Nozaki et al., "Electric-field-induced ferromagnetic resonance excitation in an ultrathin ferromagnetic metal layer," Nature Physics, published online Apr. 29, 2012, 6 pp.
Tsujikawa et al., "Finite Electric Field Effects in the Large Perpendicular Magnetic Anisotropy Surface Pt/Fe/Pt(001): A First-Principles Study," Physical Review Letters, Jun. 18, 2009, 4 pp.
He et al., "First principles study of the electric field effect on magnetization and magnetic anisotropy of FeCo/MgO (001) thin film," American Institute of Physics, published online Aug. 17, 2011, 3 pp.
Nakamura et al., "Giant Modification of the Magnetocrystalline Anisotropy in Transition-Metal Monolayers by an External Electric Field," Physical Review Letters, May 5, 2009, 4 pp.
Bonell et al., "Large change in perpendicular magnetic anisotropy induced by an electric field in FePd ultrathin films," Applied Physics Letters, Jun. 9, 2011, 3 pp.
Wang et al., "Low-power non-volatile spintronic memory: STT-RAM and beyond," Journal of Applied Physics, published online Jan. 31, 2013, 11 pp.
Fusil et al., "Magnetoelectric Devices for Spintronics," Annual Review of Materials Research, Mar. 21, 2014, 28 pp.
Chiba et al., "Electric-field control of magnetic domain-wall velocity in ultrathin cobalt with perpendicular magnetization," Nature Communications, Published Jun. 6, 2012, 7 pp.
Heinonen et al., "Perpendicular Spin Torque in Magnetic Tunnel Junctions," Physical Review Letters, Aug. 6, 2010, 4 pp.
Li et al., "Perpendicular Spin Torques in Magnetic Tunnel Junctions," Physical Review Letters, Jun. 17, 2008, 4 pp.
Zhernenkov et al., "Electric-field modification of magnetism in a thin CoPd film," Physical Review B, Jul. 20, 2010, 7 pp.
Gamble et al., "Electric Field Induced Magnetic Anisotropy in a Ferromagnet," Physical Review Letters, May 27, 2009, 4 pp.
Ikeda et al., "A perpendicular-anisotropy CoFeB—MgO magnetic tunnel junction," Nature Materials, published online Jul. 11, 2010, 5 pp.
Haraguchi et al., Electric-field effects on magnetic anisotropy in Pd/Fe/Pd(001) surface, Journal of Physics D: Applied Physics, Feb. 6, 2011, 16 pp.
Oda et al., "A comparative ab initio study on electric-field dependence of magnetic anisotropy in MgO/Fe/Pt and MgO/Fe/Au films," Journal of Applied Physics, Apr. 2011, 3 pp.
Amiri et al., "Voltage-Controlled Magnetic Anisotropy in Spintronic Devices," World Scientific, vol. 2, No. 3, Oct. 29, 2012, 10 pp.
Nozaki et al., "Voltage-induced perpendicular magnetic anisotropy change in magnetic tunnel junctions," Applied Physics Letters, Jan. 11, 2010, 3 pp.

* cited by examiner

FIG. 9A
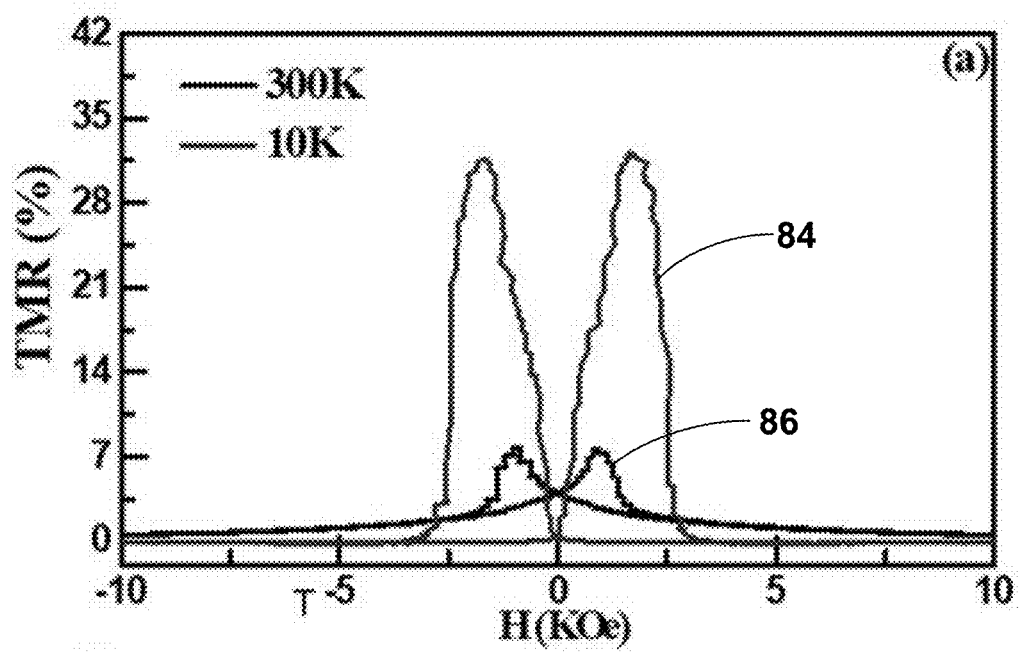
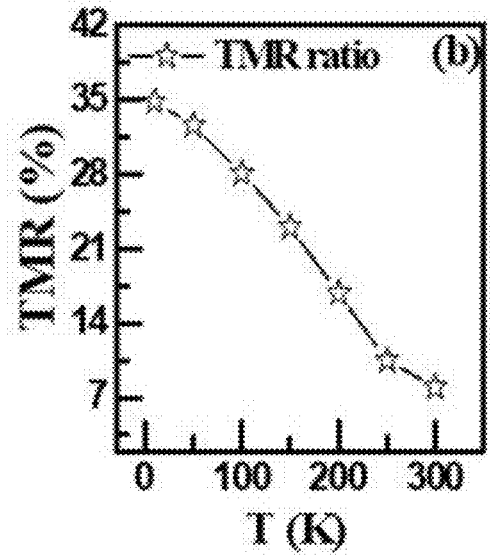
FIG. 9B
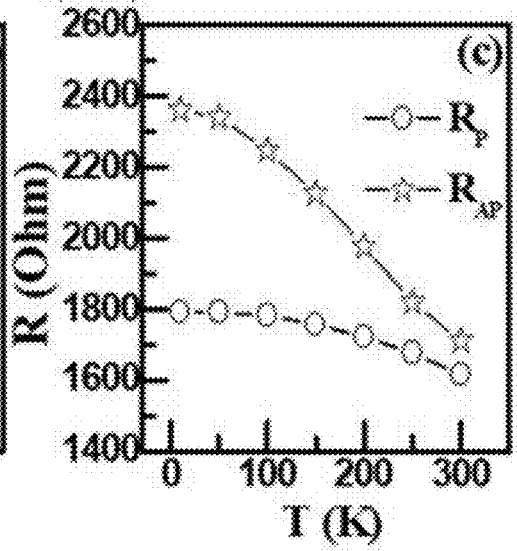
FIG. 9C

FIG. 10B    FIG. 10C

MAGNETIC STRUCTURES INCLUDING FEPD

This application claims the benefit of U.S. Provisional Application No. 62/429,362 filed Dec. 2, 2016, which is incorporated herein by reference in its entirety.

GOVERNMENT INTEREST

This invention was made with government support under Grant No. HR0011-13-3-0002 awarded by the Department of Defense/Defense Advanced Research Projects Agency (DARPA). The government has certain rights in the invention.

TECHNICAL FIELD

This disclosure relates to articles including magnetic structures, and more particularly, magnetic structures for memory and logic devices.

BACKGROUND

The scaling of conventional semiconductor devices may be limited by factors including device reliability and increased power consumption. Improvement in the performance of memory and computational devices is continuously pursued. Spin-based or spintronic devices may be used as alternatives to or in conjunction with electronic devices. Spin-based effects may be used by devices such as spintronic devices that harness the intrinsic spin of electrons and their associated magnetic moments, in addition to electronic phenomena that arise from the fundamental electronic charges of electrons. Magnetic structures may be used in spintronic devices including memory and computational devices. For example, memory devices such as magnetic random access memory (MRAM) or spin-transfer torque random access memory (STT-RAM) may be based on the relative magnetic orientation of multiple magnetic layers.

SUMMARY

In general, the disclosure describes magnetic structures that include a magnetic stack that includes a free layer including FePd (an iron palladium alloy) with perpendicular magnetic anisotropy. In some examples, example perpendicular synthetic antiferromagnetic (p-SAF) structures may include a composite free layer including at least one layer including FePd.

In some examples, the disclosure describes an article including a fixing layer and a composite free layer. The composite free layer includes a first layer including an FePd alloy. The FePd alloy exhibits perpendicular magnetic anisotropy.

In some examples, the composite free layer may include multiple sublayers, including a first layer that includes FePd with perpendicular magnetic anisotropy, a second layer that includes, for example, CoFeB or a Heusler alloy, and a diffusion barrier between the first layer and the second layer. The diffusion barrier may reduce or substantially eliminate diffusion of Pd into the second layer.

In some examples, an example technique includes forming a composite free layer by forming a first layer comprising an FePd alloy. The FePd alloy has perpendicular magnetic anisotropy. The example technique includes forming a fixing layer adjacent the composite free layer.

In some examples, an example technique includes biasing a substantially perpendicularly magnetized composite free layer from a first perpendicular magnetic orientation to a second perpendicular magnetic orientation that is different from the first perpendicular magnetic orientation by exerting a field from a substantially perpendicular magnetized fixing layer on the composite free layer. The composite free layer includes an FePd alloy having perpendicular magnetic anisotropy. The composite free layer has the first magnetic orientation in the absence of an applied magnetic field. The example technique includes subjecting the composite free layer to an external electric field to subject the composite free layer to a magnetic switching torque.

In some examples, an example technique includes biasing a substantially perpendicularly magnetized composite free layer from a first perpendicular magnetic orientation to a second perpendicular magnetic orientation that is different from the first magnetic orientation by exerting a field from a substantially perpendicular magnetized fixing layer on the composite free layer. The composite free layer includes an FePd alloy having perpendicular magnetic anisotropy. The composite free layer has the first perpendicular magnetic orientation in the absence of an applied magnetic field. The example technique includes generating a spin current through a spin Hall channel to subject the composite free layer to a magnetic switching torque.

BRIEF DESCRIPTION OF DRAWINGS

FIG. 9A is a chart illustrating magnetoresistance curves of a L1$_0$ FePd/Ta/CoFeB/MgO/CoFeB/Ta/[Co/Pd]n p-MTJ including a Ta diffusion barrier, at 10 K and 300 K.

FIG. 9B is a chart illustrating the temperature dependence of TMR ratio (open stars) in FePd p-MTJs with Ta diffusion barrier.

FIG. 9C is a chart illustrating the temperature dependence of resistance of the parallel state (open circles) and the antiparallel state (open stars) in FePd p-MTJs with Ta diffusion barrier.

FIG. 10B is a chart illustrating the temperature dependence of TMR ratio (open stars) in FePd p-MTJs with W diffusion barrier.

FIG. 10C is a chart illustrating the temperature dependence of resistance of the parallel state (open circles) and the antiparallel state (open stars) in FePd p-MTJs with W diffusion barrier.

Figure 1A:
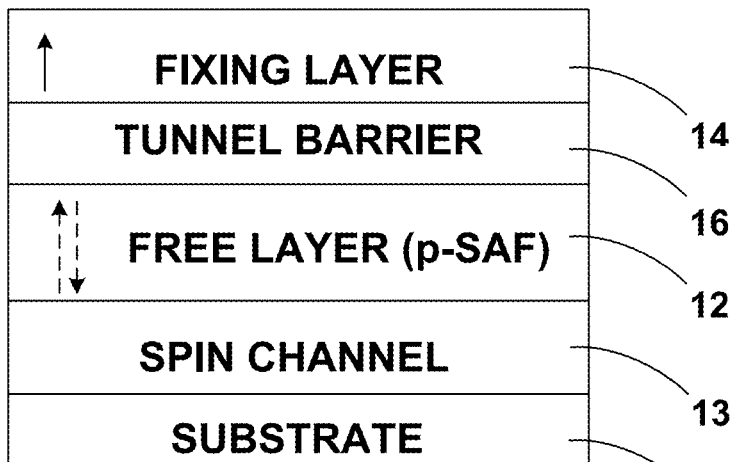
FIG. 1A is a conceptual and schematic block diagram illustrating an example article including a perpendicular magnetic structure including a free layer and a fixing layer.

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

Using materials with perpendicular magnetic anisotropy (PMA) to develop spintronic devices has attracted great interest for realizing ultra-low power consumption, high-density, non-volatile spin memory and logic devices (e.g., spin-transfer-torque (STT) and spin-orbit torque (SOT) magnetoresistive random access memory (MRAM), and all spin logic). One of the building blocks of spintronic devices is the magnetic tunnel junction (MTJ) device. As the size of such devices shrinks, MTJ-based devices may preferably maintain industry standards, for example, 10 years of reliable storage (thermal stability factor Δ≥60) and a low reversal current density for current-induced magnetization switching, which may be used to reverse MTJ memory elements. Preferably, the ferromagnetic layer may possess both a large PMA energy ($K_u$) and a low damping constant ($\alpha$).

Spin-orbit torque (SOT) induced magnetization switching has emerged as one way to realize ultralow power consumption devices. An in-plane charge current is injected into a non-magnet (NM)/ferromagnet (FM) bilayer structure, in which the NM layer is a spin Hall channel with large spin orbit coupling and generates a spin current in the vertical direction. The vertical spin current, which accumulates at the interface between the NM and FM layers, exerts anti-damping torque and a field-like torque to switch the magnetization of the adjacent FM layer, then realizing the spin current generated from the spin Hall channel switches three-terminal MTJ devices. Electric-field or voltage induced or controlled magnetization switching in single ferromagnetic layers and their MTJs may be used to realize ultra-low power consumption memory devices. The magnetocrystalline anisotropy (MCA) of perpendicular thin films can be modified by an electric-field effect, which may provide a way to further enable manipulating nanoscale spintronic devices. In some examples, electric field-driven spintronic devices may be compatible with the constraints of size and power consumption reduction, provided that a large effect of the electric field on the magnetic properties is obtained. In addition, by modifying or switching the magnetization of ferromagnetic layer, pure electric-field switching of magnetization of MTJs with p-SAF free layers may be attained.

Among bulk PMA materials, because of the weak spin orbit coupling of Palladium (Pd) compared to Platinum (Pt) in Pt-based PMA materials, Pd-based PMA materials possess a relatively large $K_u$ and may show a relatively low $\alpha$, which are useful for satisfying the demand of the high thermal stability and low critical current spintronic devices. Among them, $L1_0$-FePd is a promising material candidate for spintronic devices due to its relatively large theoretical PMA ($K_u$~13-14 Merg/cm$^3$), relatively low $\alpha$ (~0.002), and low processing temperature. In addition, the perpendicular magnetic anisotropy of ultrathin FePd thin films may be affected by electric fields. For example, an electric field may modify the interfacial magnetic anisotropy in an FePd/MgO interface, which may be used for switching magnetization within magnetic structures including FePd materials.

However, Pd from Pd-based PMA materials can diffuse into the adjacent layers, for example, MgO barrier or adjacent ferromagnetic layer like CoFeB layer during the thermal treatment process, which may be reduce the tunnel magnetosresistance (TMR) ratio or otherwise negatively impact the devices. For example, a reduction in TMR ratio when the post-annealing temperature is higher than 300° C. may indicate that the Pd of FePd thin film diffused into an adjacent layer, for example, CoFeB layer, even in the presence of an MgO barrier layer, with increasing post-annealing temperatures. Diffusion of species other than Pd may also pose problems. For example, in p-MTJs including Mn-based PMA Heusler alloy, Mn may diffuse into adjacent layers when the devices are post-annealed at high temperature.

A diffusion barrier, for example, a relatively thin layer (<1.0 nm) with good thermal stability, may block, reduce, or prevent diffusion of Pd or Mn (or other diffusing species) and increase a maximum thermal treatment temperature for Pd-based or Mn-based Heusler perpendicular magnetic tunnel junctions (p-MTJs), which may satisfy with the demand of standard back-end-of-line (BEOL) process compatibility.

The disclosure describes magnetic structures including a free layer including perpendicular magnetized FePd alloy. In some examples, the free layer may be a composite including additional FePd layers or other layers, for example, CoFeB. In some examples, the free layer may include a diffusion barrier, for example, to reduce or substantially prevent diffusion of Pd from FePd into another layer. In some examples, the diffusion barrier layer may include one or both of Tantalum (Ta) or Tungsten (W). In some examples, the disclosure describes (p-MTJs) p MTJs including a composite free layer including CoFeB/(Ta/W)/FePd stacks.

A composite free layer including FePd layer coupled with CoFeB layer by diffusion barriers may provide good perpendicular property and thermal stability. For example, in comparison with the FePd p-MTJs without a diffusion barrier (TMR<1.0%), the TMR ratio may be enhanced in FePd p-MTJs with Ta and W diffusion barriers (introduced between FePd and CoFeB layers to block Pd diffusion). In some examples, 8.0% room temperature and 34.8% 10 K TMR ratios were obtained in Ta diffusion barrier p-MTJs, and 7.0% room temperature and 45.8% 10 K TMR ratios were observed in W diffusion barrier p-MTJs after post-annealing at 350° C. The diffusion barrier (like Ta and W) may result in a high TMR ratio and enhance the thermal stability in bulk p-MTJs (for example, FePd and Mn-based Heusler p-MTJs).

Ta- or W-based diffusion barrier layers may also be used as spacers, which can allow ferromagnetic layers to form strong ferromagnetic or antiferromagnetic coupling when their thickness is thinner than ~0.7 nm. The resistance (R) in parallel and antiparallel states in p-MTJs with W diffusion barrier showed the very strong temperature dependence compared with that of p-MTJs with Ta diffusion barrier, which may be due to the better thermal stability of W film than that of Ta film. These experimental results suggest that the diffusion barrier may be used to achieve a high TMR ratio in p-MTJs with high thermal treatment process, such as FePd and Mn-based bulk p-MTJs.

Thus, magnetic articles and structures according to the disclosure may use diffusion barrier layers, for example, including Ta and W, to block diffusion and enhance the TMR ratio in FePd- or Mn-based Heusler-based p-MTJs. However, other diffusion barriers and multilayer diffusion barriers may be used to achieve high TMR ratio and good thermal stability in p-MTJs while satisfying demands of semiconductor processes. The Ta- and W-based diffusion barriers are provided as examples and should not be considered limiting.

The disclosure also describes magnetization switching in bulk perpendicular magnetic tunnel junction (p-MTJ) devices. For example, electric-field controlled magnetization switching behavior in bulk p-MTJs with FePd perpendicular synthetic antiferromagnetic (p-SAF) free layer may be performed at room temperature.

FIG. 1A is a conceptual and schematic block diagram illustrating an example article 10 including a perpendicular magnetic structure including a free layer 12 and a fixing layer 14. In some examples, free layer 12 includes an FePd alloy having perpendicular magnetic anisotropy. In some examples, free layer 12 includes a perpendicular synthetic antiferromagnetic (p-SAF) structure. The p-SAF structure may include the FePd alloy. The p-SAF structure may include at least one p-SAF layer. In some examples, the at least one p-SAF layer may include the FePd alloy. The FePd alloy may ultimately provide or contribute to switchable perpendicular magnetic orientations of free layer 12. In some examples, the FePd alloy includes an $L1_0$-phase FePd alloy. A layer including an $L1_0$-phase FePd alloy may have a relatively low damping coefficient (for example, about 0.007 or lower), a tunable, relatively large bulk perpendicular anisotropy (for example, about 14 Merg/cc), be relatively chemically stable, and have a relatively low deposition and/or annealing temperature.

In this disclosure, the term "perpendicular" includes angles within a predetermined range of 90°, accounting for limitations of precision, accuracy, tolerances, specifications, and deviations in manufacturing and measurement. For example, unless defined differently, the term "perpendicular" includes "substantially perpendicular" angles, for example, angles within a range of 90°±10°. However, in some examples, the term may be further restrictively defined, as described in the disclosure.

For example, both free layer 12 and fixing layer 14 may be perpendicularly magnetized, for example, defining respective magnetization orientated within a predetermined tolerance of 90°, with respect to respective planes defined by free layer 12 or fixing layer 14, for example, by respective major surfaces defined by free layer 12 or fixing layer 14. In some examples, perpendicular magnetization includes substantially perpendicular magnetization, for example, including 90°±10°, 90°±5°, 90°±3°, 90°±1°, or 90°±0.5°. In some examples, substantially perpendicular magnetization includes a magnetization orientation between and including 85° and 95°. In some examples, substantially perpendicular magnetization includes a magnetic orientation between and including 89° and 91°. Providing such substantially perpendicular magnetizations including respective magnetic orientations between and including 89° and 91° may provide free layer 12 with predictable, reliable, and stable biasing and switching.

While both free layer 12 and fixing layer 14 may be substantially perpendicularly magnetized, they may have different perpendicular orientations from each other. For example, fixing layer 14 may have a substantially fixed substantially perpendicular magnetization (for example, one of "up" or "down" perpendicular orientation with respect to a major surface defined by article 10). In contrast, free layer 12 may have a switchable orientation, between two predetermined perpendicular magnetizations: for example, one of "up" or "down" as a first perpendicular magnetic orientation, and the other of "up" or "down" as a second perpendicular magnetic orientation. For example, in the absence of an external field, free layer 12 may assume the "up" magnetization, and may switch to the "down" magnetization in response to an external field or a stray field, or another electrical or strain stimulus. In some examples, the first perpendicular magnetic orientation of free layer 12 is aligned in the same direction as the magnetization of fixing layer 14 (for example both up, or both down). In other examples, the first perpendicular magnetic orientation of free layer 12 is aligned in the opposite direction as the magnetization of fixing layer 14 (for example one being up, the other being down). While the terms "up" and "down" have been used, the magnetic orientations may include any two opposite perpendicular orientations with reference to a major surface defined by article 10, or by one or both of free layer 12 or fixing layer 14, regardless of the gravitational orientation.

In some examples, free layer 12 is stably biased to the first perpendicular magnetic orientation by a field from fixing layer 14, in the absence of an applied or external field or stimulus. Free layer 12 may be stably switchable to the second perpendicular magnetic orientation from the first perpendicular magnetic orientation, in the presence of the applied or external field or stimulus, and may substantially retain the second magnetic orientation as long as the applied or external field or stimulus is present, or vice versa. The term "substantially retain" includes relatively minor temporal or spatial deviations in the magnetic orientation.

Free layer 12 may be on or adjacent to fixing layer 14, with at least one intermediate layer. For example, a major surface defined by free layer 12 may be in substantially parallel to a major surface defined by fixing layer 14, and may be in contact with or spaced from each other. For example, article 10 may include a tunnel barrier 16 between free layer 12 and fixing layer 14.

In some examples, article 10 includes a substrate 18. For example, free layer 12 may be disposed on substrate 18, as shown in FIG. 1A, with others of diffusion barrier 16 or fixing layer 14 adjacent and spaced from substrate 18. In other examples, fixing layer 14 may be disposed on substrate 18, with free layer 12 being adjacent but spaced from substrate 18. Substrate 18 may include any suitable material on which magnetic structures may be deposited or formed, for example, one or both of free layer 12 or fixing layer 14. In some examples, substrate 18 includes MgO. In some examples, substrate 18 includes a piezoelectric material. Although not shown, substrate 18 may include one or more layers including a physical substrate, an adhesion layer, a seed layer, and underlayer spacing and insulation layers, and the like.

In some examples, article 10 may optionally include a spin channel 13. In some such examples, spin channel 13 may be used for spin transfer torque (STT) switching of the magnetization of free layer 12. For example, a charge current may be passed through spin channel 13. The charge current may result in a spin-polarized current, and the spin-polarized current may switch the magnetization of free layer 12.

In some examples, free layer 12 may include a composite of different layers. For example, free layer 12 may be a composite free layer including at least one layer in addition to an FePd alloy layer.

Figure 1B:
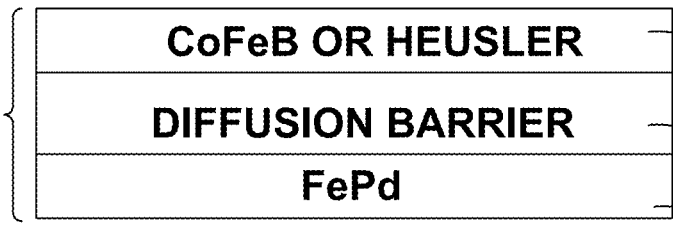
FIG. 1B is a conceptual and schematic block diagram illustrating an example composite free layer.

FIG. 1B is a conceptual and schematic block diagram illustrating an example composite free layer 12a. Composite free layer 12a may include a first layer 20 including an FePd alloy. The FePd alloy has perpendicular magnetic anisotropy. In some examples, first layer 20 defines a thickness between about 2 nm and about 15 nm.

Composite free layer 12a includes at least one layer in addition to first layer 20. In some examples, composite free layer 12a includes a second layer 22 including a CoFeB alloy. Providing the CoFeB may enhance the TMR ratio. In some examples, ferromagnetic oxides may be used instead of, or in addition to, CoFeB. The ferromagnetic oxides may include one or more of Yttrium iron garnet (YIG), $BaFe_{12}O_9$, or $Tm_3Fe_5O_{12}$.

In some examples, second layer 22 includes, instead of, or in addition to, CoFeB, a Heusler alloy or a half-metallic Heusler alloy. Heusler alloys that may be used in examples according to the disclosure include magnetic intermetallics with a face-centered cubic crystal structure and a composition of XYZ (half-Heuslers) or $X_2YZ$ (full-Heuslers), where X and Y are transition metals and Z is in the p-block. Examples of Heusler alloys include $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Co_2NiGa$, $Pd_2MnAl$, $Pd_2MnIn$, $Pd_2MnSn$, $Pd_2MnSb$, $Co_2FeSi$, $Co_2FeAl_{0.5}Si_{0.5}$ $Co_2FeAl$, $Fe_2Val$, $Mn_2VGa$, or $Co_2FeGe$. Heusler alloys may have a theoretical 100% spin polarization and low damping constant, which may provide a high TMR ratio in MTJ devices.

In some examples, second layer 22 defines a thickness between and including about 0.8 and about 5 nm. In some examples, second layer 22 defines a thickness between and including about 0.5 and about 2.5 nm.

In examples in which article 10 includes a composite free layer, the composite free layer may itself include a diffusion barrier layer, to reduce or prevent diffusion of ionic or other species between layers of the composite free layer. For example, as shown in FIG. 1B, composite free layer 12a may include a diffusion barrier layer 24. Diffusion barrier layer 24 is between first layer 20 and second layer 22. Diffusion barrier 24 may help in preserving the different magnetic behaviors of layers within free layer 12, for example, by preventing or reducing the diffusion of ionic or other species that may ultimately affect, impact, or deteriorate the magnetic orientation, or the switching of free layer 12. In some examples, diffusion barrier 24 includes at least one of metal species, for example, Vanadium (V), Chromium (Cr), Ruthenium (Ru), Tantalum (Ta), TaN, TiN, Tungsten (W), Molybdenum (Mo), or Iridium (Ir). In some examples, diffusion barrier layer 24 includes at least one of Ta or W. For example, diffusion barrier layer 24 including Ta or W may reduce or prevent the diffusion of Pd from FePd, for example, during high-temperature processes such as post-annealing processes. In some examples, diffusion barrier layer 24 or other diffusion barriers according to the disclosure may include oxides, in addition to, or instead of, metal species. For example, the oxides may include one or more of MgO, $TiO_x$, $TaO_x$, or $SrRuO_3$. In some examples, diffusion barrier layer 24 defines a thickness of between about 0.3 nm and about 5 nm, or between about 0.3 nm and about 1.5 nm, or about 0.8 nm.

Figure 1C:
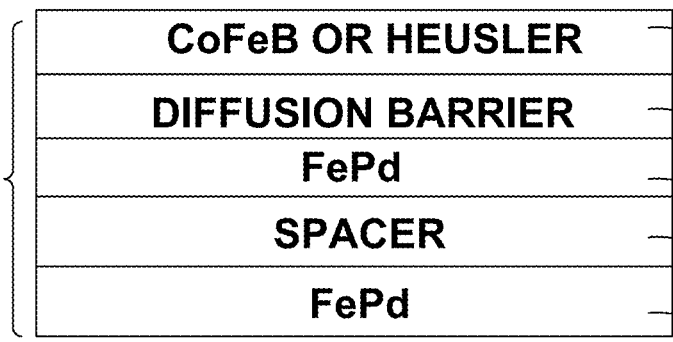
FIG. 1C is a conceptual and schematic block diagram illustrating an example composite free layer including a perpendicular synthetic antiferromagnetic (p-SAF) structure with a spacer layer.

FIG. 1C is a conceptual and schematic block diagram illustrating an example composite free layer 12b including a perpendicular synthetic antiferromagnetic (p-SAF) structure with a spacer layer 26. Composite free layer 12b is similar to composite free layer 12a, in that composite free layer 12b also includes at least one FePd layer 20. The at least one FePd layer 20 may include a p-SAF structure. In addition, composite free layer 12b may also include one or both of second layer 22 or diffusion barrier 24.

Composite free layer 12b also includes a third layer 28. Third layer 28 also includes an FePd alloy. The FePd alloy in third layer 28 may be substantially the same as or different from the FePd alloy in first layer 20. In some such examples, first layer 20 and third layer 28 may define respective thicknesses between about 1 nm and about 5 nm.

Composite free layer 12b also includes spacer layer 26, which may space apart first and third layers 20 and 28, as shown in FIG. 1C, being disposed between first layer 20 and third layer 28. For example, spacer layer 26 may space apart magnetic fields or stray fields between fixing layer 14 in FIG. 1A and a layer of composite free layer 12b in FIG. 1C, or otherwise reduce or prevent magnetic or other interactions between first layer 20 and third layer 28. Spacer layer 26 may define a thickness between about 0.3 nm and about 2.5 nm. In some examples, spacer layer 26 defines a thickness between about 0.8 nm and about 1.6 nm, or between about 0.8 nm and about 1.4 nm. In some examples, spacer layer 26 includes at least one of V, Cr, Ru, Ta, W, or Mo. In some examples, spacer layer 26 includes Ru. In some examples, the Ru includes non-hcp phase Ru, with unit cell dimension of about 3.826 Angstrom. In examples in which composite free layer 12b includes diffusion barrier layer 24, first layer 20 may be between diffusion barrier layer and third layer 28. The compositions and thickness of spacer layer 26 may be the same as or different from that of diffusion barrier layer 24. In some examples, spacer layer 26 may also act as a diffusion barrier. While composite free layer 12b may include one "sandwich" including spacer layer 26 between first and third layers 20 and 28 including FePd, in other examples, a composite free layer may include multiple spacer and FePd layers.

Figure 1D:
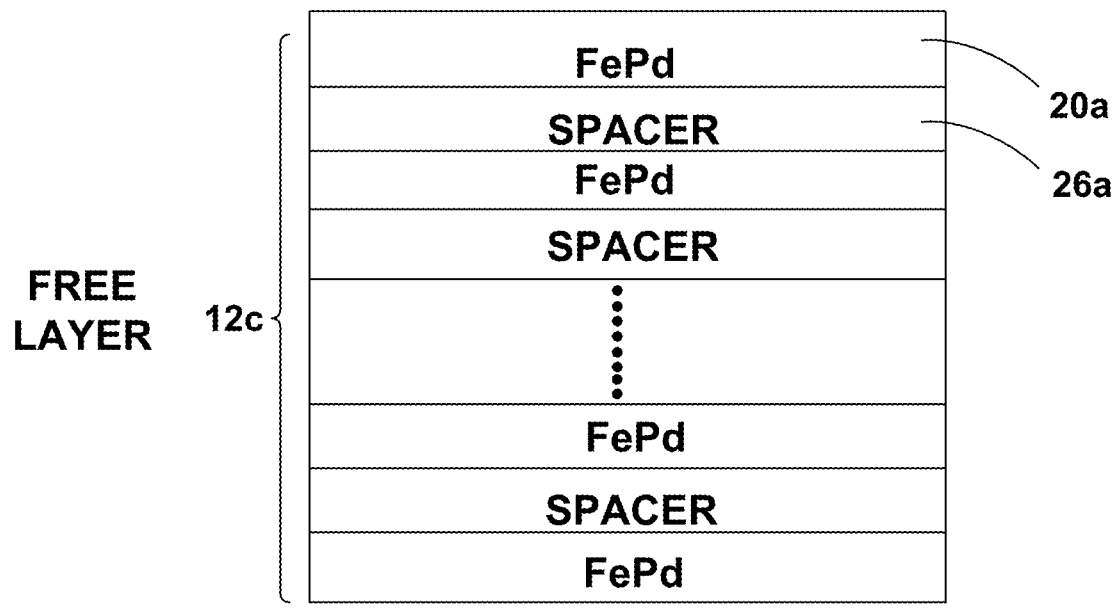
FIG. 1D is a conceptual and schematic block diagram illustrating an example composite free layer including a p-SAF with alternating magnetic and spacer layers.

FIG. 1D is a conceptual and schematic block diagram illustrating an example composite free layer 12c including a p-SAF with alternating pluralities of magnetic and spacer layers 20a and 26a, respectively. Each magnetic layer 20a may have substantially the same composition and thickness, for example, a composition and thickness as described with respect to FePd layers according to the disclosure, for example, first or third layer 20 or 28. In some examples, each magnetic layer 20a of the plurality of magnetic layers defines a thickness between about 1 nm and about 5 nm. In some examples, the plurality of magnetic layers includes first layer 20. Each of spacer layer 26a of the plurality of spacer layers may have substantially the same composition and thickness, for example, a composition and thickness as described with respect to spacer layers according to the disclosure, for example, spacer layer 26. In some examples, each spacer layer 26a of the plurality of spacer layers defines a thickness between about 0.3 nm and about 1.6 nm. Thus, in some examples, a composite free layer may be formed using alternative layers of FePd, even without using additional components such as CoFeB or Heusler alloys.

Thus, example articles according to the disclosure may include a free layer defined by a single layer, or may include a composite free layer including more than one layer. Thus, free layer 12 may include composite free layers according to the disclosure. While example articles may include single or composite free layers, in some examples, example articles may also include composite fixing layers.

Figure 1E:
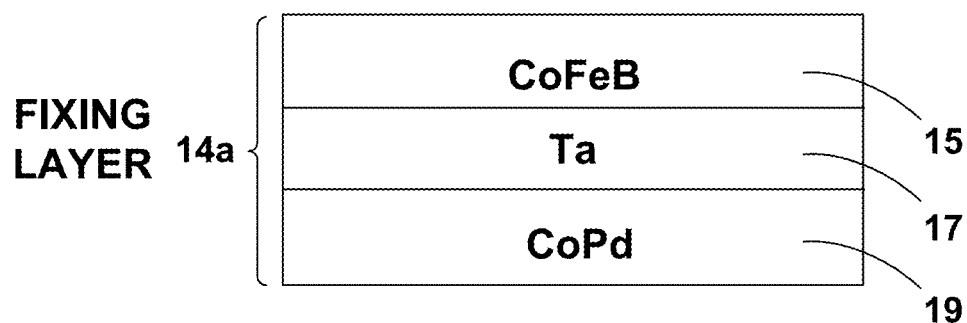
FIG. 1E is a conceptual and schematic block diagram illustrating an example composite fixing layer including first, second, and third fixing layers.

FIG. 1E is a conceptual and schematic block diagram illustrating an example composite fixing layer 14a including first, second, and third fixing layers 15, 17, and 19. In some examples, first fixing layer 15 includes a CoFeB alloy or Heusler alloys. In some examples, second fixing layer 17 may act as a diffusion barrier or a spacer, for example, including Ta or W. In the example shown in FIG. 1E, second fixing layer 17 includes Ta. In some examples, third fixing layer 19 includes a CoPd (cobalt palladium) alloy. In some examples, third fixing layer 19 may include more than one CoPd layer. As shown in FIG. 1E, in some examples, second fixing layer 17 is between first fixing layer 15 and third fixing layer 19. In some examples, fixing layer 14 includes composite fixing layer 14a.

Example articles according to the disclosure may be used in or as magnetic structures in magnetic devices, for example, in a magnetic tunnel junction device.

Figure 2A:
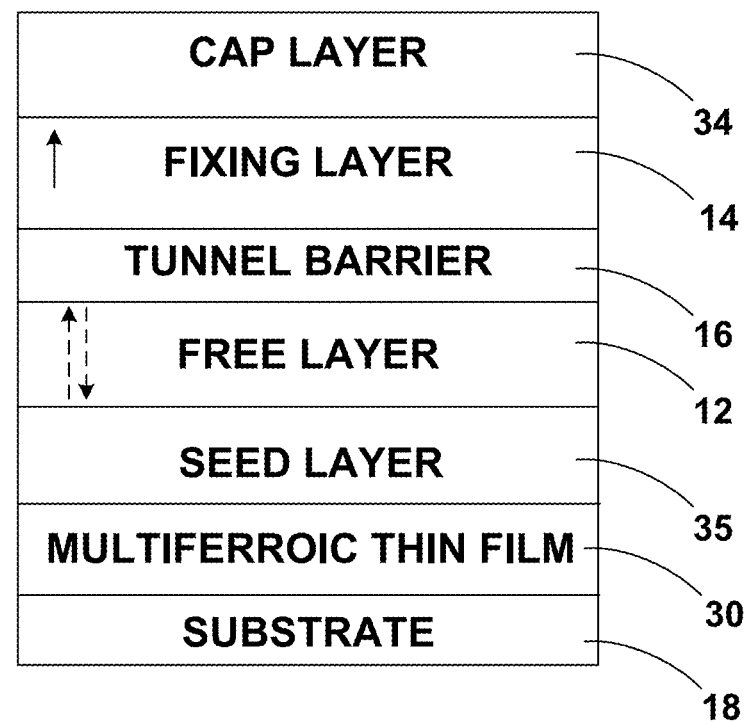
FIG. 2A is a conceptual and schematic block diagram illustrating an example article including a perpendicular magnetic tunnel junction (p-MTJ) stack including a free layer, a fixing layer, and a tunnel barrier layer, with additional optional layers.

FIG. 2A is a conceptual and schematic block diagram illustrating an example article 10a including a perpendicular magnetic tunnel junction (p-MTJ) stack including free layer 12, fixing layer 14, and a tunnel barrier 16, with additional optional layers. One or both of free layer 12 and fixing layer 14 may include a respective composite including more than one sub-layers, as described in the disclosure. Tunnel barrier layer 16 may be between free layer 12 and fixing layer 14. Tunnel barrier 16 may include any suitable composition acting as a tunnel barrier between free layer 12 and fixing layer 14. For example, tunnel barrier 16 may include insulating materials such as MgO. In some examples, tunnel barrier 16 may be thin enough (approximately a few nanometers) that electrons may tunnel from free layer 12 to fixed layer 14, or vice versa. In some examples, article 10a may include one or more additional layers, for example, substrate 18 according to the disclosure.

In some examples, substrate 18 may be a multiferroic substrate. For example, substrate 18 may include a multiferroic material. Multiferroic materials are materials having more than one ferroic order, for example, more than one of ferromagnetism, ferroelectricity, or ferroelasticity, in the same phase. In some examples, article 10a may include at least one multiferroic thin film 30, for example, between free layer 12 and substrate 18. The multiferroic substrate may include at least one of $BiFeO_3$ or $BaTiO_3$. At least one multiferroic thin film 30 may include comprises at least one of $BiFeO_3$ or $BaTiO_3$. In examples in which article 10a includes both tunnel barrier 16 and at least one multiferroic thin film 30, free layer 12 may be between at least one multiferroic thin film 30 and tunnel barrier 16, and tunnel barrier 16 may be between free layer 12 and fixing layer 14.

In some examples in which article 10a includes multiferroic thin film 30, free layer 12 may include a composite free layer according to the disclosure, and fixing layer 14 may include composite fixing layer 14a. The antiferromagnetic or ferroelectric properties of multiferroic thin film 30 may be tuned by exerting an electric field on it. Thus, an exerted electric field may modify the antiferromagnetic or ferroelectric properties, which can be used to control the magnetization of ferromagnetic layers on or adjacent multiferroic thin film 30, to switch their magnetization and realize strain or electric field switching of spintronic devices.

Optional additional layers in article 10a may include one or more of a multiferroic thin film 30, a cap layer 34, or a seed layer 35.

In some examples, cap layer 34 includes a metal, alloy, or insulator including one or both of Ta or RuW as a bulk material, alloy component, or as a dopant. Cap layer 34 may influence the magnetization of one or both of free layer 12 or fixing layer 14.

Seed layer 35 may be disposed between free layer 12 and multiferroic thin film 30 or substrate 18, as shown in FIG. 2A, or free layer 12 may be formed on seed layer 35. In examples in which article 10a includes both tunnel barrier 16 and seed layer 35, tunnel barrier 16 may be between free layer 12 and fixing layer 14. Seed layer 35 may promote or induce one or more of formation of a predetermined texture, crystallographic orientation, lattice matching, and control grain structure, size, or roughness, or ultimately, magnetic anisotropy in free layer 12. In some examples, seed layer 35 may act as a bottom electrode or otherwise provide a conductive path adjacent the magnetic structure including free layer 12 and fixed layer 14. In some examples, seed layer 35 includes one or more of Cr, CrRu, Pd, or Pt. In some examples, seed layer 35 may include Cr/Ru, and in other examples, seed layer 35 may include Cr/Pt. Seed layer 35 may define a thickness between and including about 1 nm and about 30 nm, or between and including about 1 nm and about 15 nm, or between and including about 3 nm and about 15 nm, or between and including about 1 nm and about 5 nm, or between and including about 15 nm and about 30 nm. Seed layer 35 may include a single layer or a composite including more than one layer (as described with reference to FIGS. 2B and 2C).

Figure 2B:
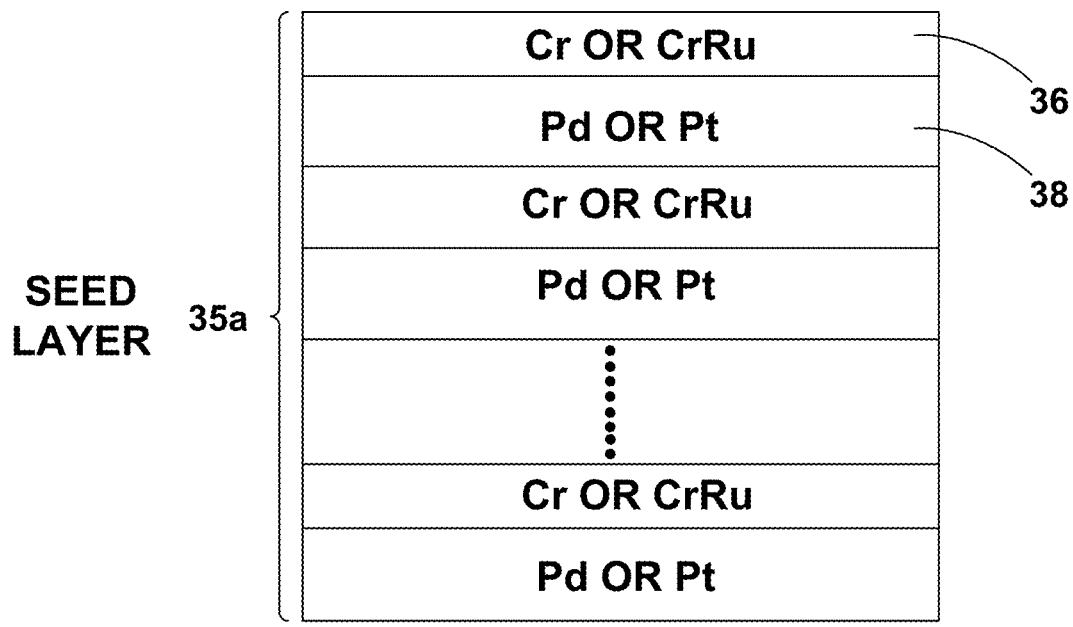
FIG. 2B is a conceptual and schematic block diagram illustrating an example composite seed layer including alternating first and second seed layers.

FIG. 2B is a conceptual and schematic block diagram illustrating an example composite seed layer 35a including alternating pluralities of first and second seed layers 36 and 38, respectively. In some examples, first seed layer 36 includes one of Cr or CrRu. For example, each first seed layer 36 of plurality of first seed layers may include Cr, or include CrRu. In some examples, second seed layer 38 includes one of Pd or Pt. For example, each second seed layer 38 of plurality of second seed layers may include Pt, or include Pd. Pd and Pt may have a good lattice mismatch with FePd.

Figure 2C:
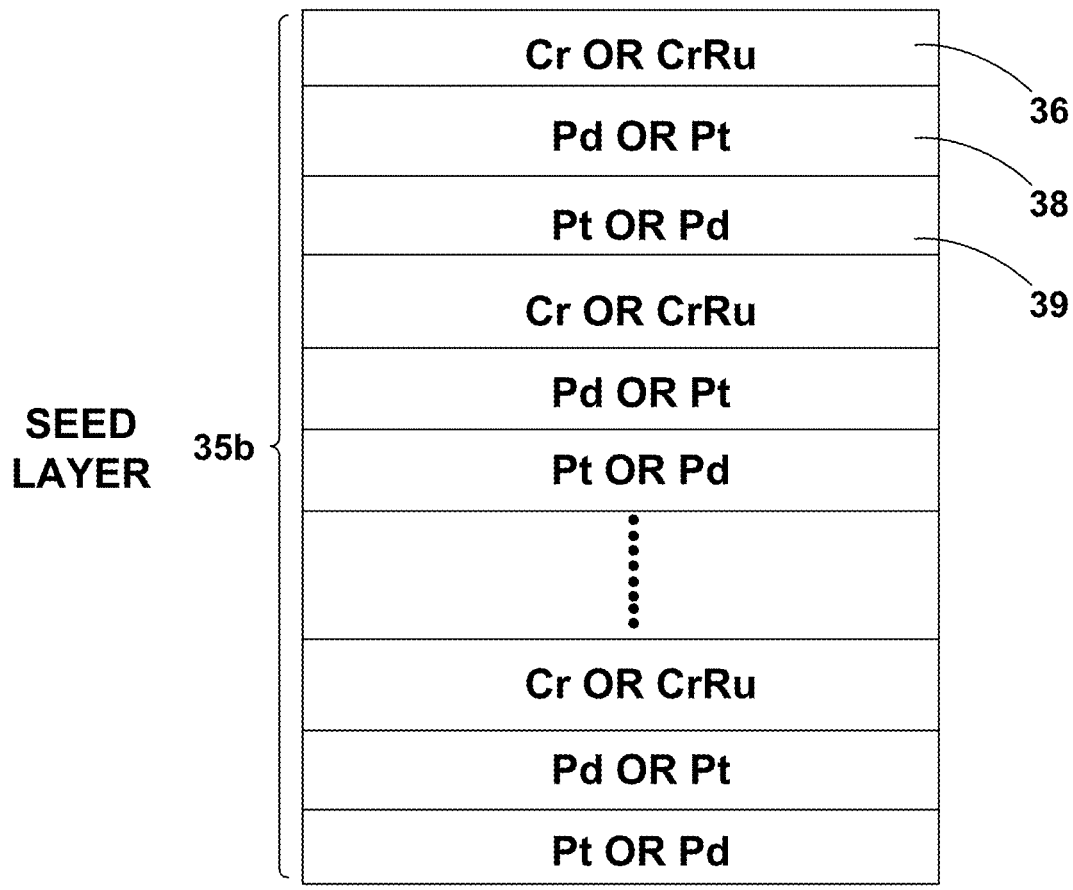
FIG. 2C is a conceptual and schematic block diagram illustrating an example composite seed layer including alternating first, second, and third seed layers.

FIG. 2C is a conceptual and schematic block diagram illustrating an example composite seed layer 35b including alternating pluralities of first, second, and third seed layers 36, 38, and 39. First or second seed layers 36 or 38 may be as described with reference to FIG. 2B. While each second seed layer 38 of the plurality of second seed layers may include one of Pt or Pd, each third seed layer 39 of the plurality of third seed layers may include the other of Pt or Pd with respect to second seed layers 38. In some examples, each of first seed layers 36, second seed layers 38, or third seed layers 39 in composite seed layers 35a or 35b define respective thicknesses between about 1 nm and about 5 nm. By using such a seed layer, the grain size, grain boundary, and crystalline structure may be controlled to control the roughness or texture of FePd or other ferromagnetic layer on the seed layer.

Thus, in some examples, seed layer 35 may include a composite, including at least one of alternating layers of 1) a first seed layer comprising Cr and 2) a second seed layer comprising Pd; alternating layers of 1) a first seed layer comprising Cr and 2) a second seed layer comprising Pt; alternating layers of 1) a first seed layer comprising Cr, 2) a second seed layer comprising Pd, and 3) a third seed layer comprising Pt; alternating layers of 1) a first seed layer comprising CrRu and 2) a second seed layer comprising Pd; alternating layers of 1) a first seed layer comprising CrRu and 2) a second seed layer comprising Pt; and alternating layers of 1) a first seed layer comprising CrRu, 2) a second seed layer comprising Pd, and 3) a third seed layer comprising Pt.

Thus, in some examples, magnetic structures or articles may include one or both of perpendicularly magnetized FePd and diffusion barriers. In some examples, magnetic structures or articles according to the disclosure may include spin-orbit torque devices with a spin Hall channel.

Figure 3:
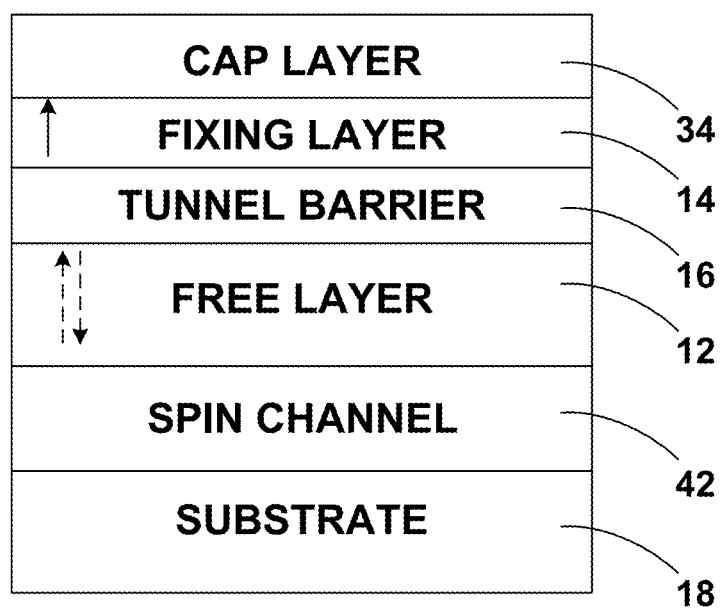
FIG. 3 is a conceptual and schematic block diagram illustrating an example article including a spin-orbit torque switching device including a free layer, a fixing layer, a tunnel barrier layer, and a spin channel.

FIG. 3 is a conceptual and schematic block diagram illustrating an example article including a spin-orbit torque switching device including free layer 12, fixing layer 14, tunnel barrier 16, and a spin channel 42. Spin channel 42 may include one or both of heavy metals or topological insulators. In some examples, spin channel 42 may include Tantalum (Ta), Tungsten (W), Platinum (Pt), Gold (Au), Aluminum (Al), Silver (Ag), Copper (Cu), or the like. In some examples, spin channel 42 may include a granular layer including fine grains and grain boundaries. For example, the granular layer may include a mixture of Ta, W, Pt, Au, Al, Ag, and/or Cu. The granular layer including fine grains and grain boundaries may increase the spin Hall effect, which increases the efficiency of converting the charge that enters spin channel 42 into the spin current (e.g., makes the charge-to-spin current conversion in an effective way). Current flowing through spin channel 42 causes a spin-current to flow that sets a magnetization state of free layer 12, optionally in combination with the effect of an external or applied field. In some examples, current flow through spin channel 42 may be used to switch magnetization of free layer 12 without an external field (for example, field-free switching).

As charge current flows through spin channel 42 in the horizontal direction, the spin-orbit coupling in spin channel 42 causes the accumulation of vertical directed spins at the top surface of conductive channel 42, thus exerting spin-orbit torque (SOT) on free layer 12. The SOT may then inject the accumulation of vertical directed spins of the spin-polarized current into free layer 12. As a result, the angular momentum of the spin-polarized current may be transferred to free layer 12 which may set the magnetization direction of free layer 12.

While spin channel 42 may be disposed "below" free layer 12, with free layer 12 between fixing layer 14 and spin channel 42, as shown in FIG. 3, in other examples, spin channel 42 may be disposed "above" free layer 12, for example, with fixing layer 14 between tunnel barrier 16 and substrate 18, and free layer 12 on tunnel barrier 16. In some examples, spin channel 42 may be on free layer 12.

The energy required to set the magnetization direction of free layer 12 may be relatively low due to high spin injection efficiency in spin channel 42. Moreover, as described above, the fine grains and grain boundaries in spin channel 42 may increase the Spin Hall effect, which may make the charge-to-spin current conversion in an effective way.

While the disclosure describes magnetic structures including FePd alloy, in some examples, in addition to, or instead of FePd alloy, one or more magnetic structures and articles according to the disclosure may use FePt, or FePdPt. For example, one or more of of FePt alloy, CoPd alloy or CoPt alloy, may be used in addition to, or instead of, the FePd alloy.

Example articles according to the disclosure may be formed using any suitable technique. Example techniques are described with reference to the example articles described with reference to FIGS. 1A through 3. However, the example techniques may be used to prepare or to use any example articles according to the disclosure.

Figure 4:
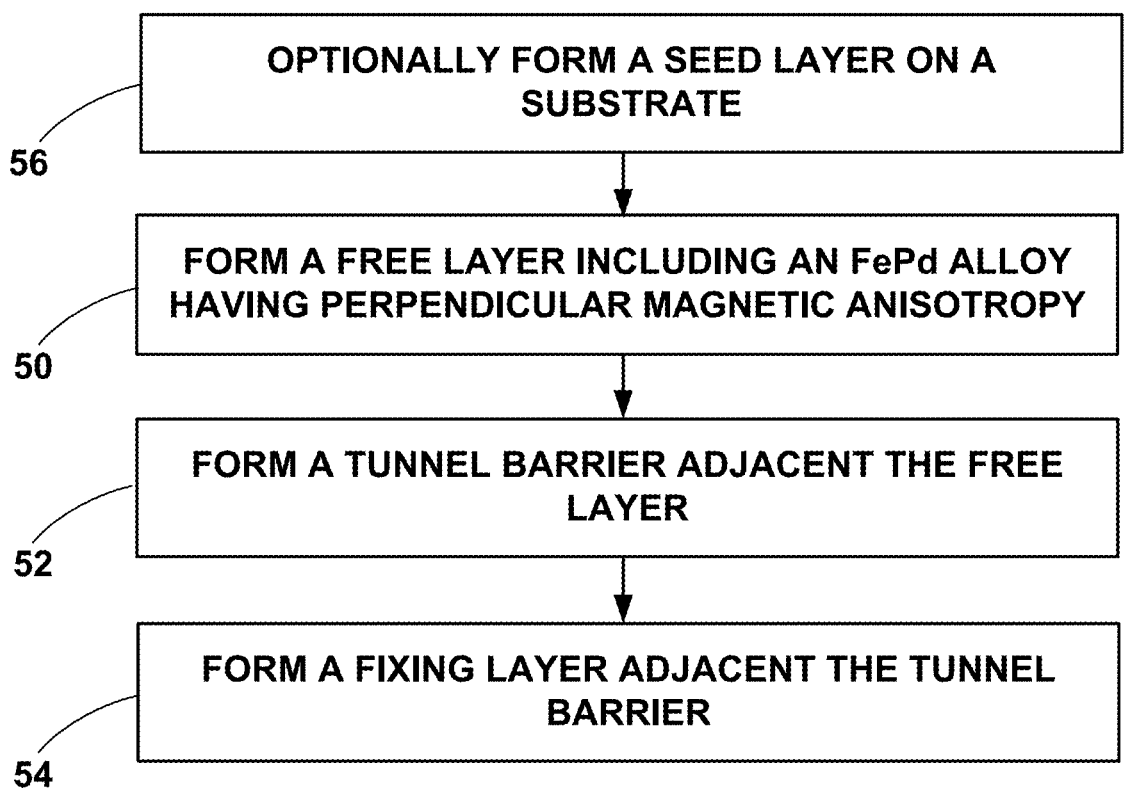
FIG. 4 is a flow diagram illustrating an example technique for preparing a magnetic structure including a free layer including an FePd alloy having perpendicular magnetic anisotropy.

FIG. 4 is a flow diagram illustrating an example technique for preparing a magnetic structure including a free layer including an FePd alloy having perpendicular magnetic anisotropy. In some examples, the example technique includes forming composite free layer 12a (or 12b or 12c) by forming first layer 20 including an FePd alloy, the FePd alloy having perpendicular magnetic anisotropy (50). In some examples, the example technique further includes forming a tunnel barrier adjacent free layer 12a (52). The example technique includes forming fixing layer 14 adjacent a tunnel barrier (54). The forming the tunnel barrier (54) may be performed before the forming of fixing layer 14 (52). In some examples, forming composite free layer 12a (or 12b or 12c) (50) further includes forming second layer 22 including at least one of a CoFeB alloy or a Heusler alloy. In some examples, forming composite free layer 12a (or 12b or 12c) (50) further includes forming spacer layer 26 on first layer 20, and forming third layer 28 including the FePd alloy on spacer layer 26. In some examples, forming composite free layer 12a (or 12b or 12c) (50) further includes forming diffusion barrier 24 on first layer 20. In some examples, forming composite free layer 12a (or 12b or 12c) (50) includes alternatingly forming a plurality of FePd layers (20, 28, . . . or 20a, . . . ) interleaved with a plurality of spacer layers 26 (or 26a), wherein each FePd layer of the plurality of FePd layers (20, 20a, or 28) includes the FePd alloy having perpendicular magnetic anisotropy. In some examples, the example technique optionally further includes forming seed layer 35 on substrate 18 (56), wherein the forming composite free layer 12a (or 12b or 12c) (50) includes forming composite free layer 12a (or 12b or 12c) on substrate 18 after the forming of seed layer 35 (56).

In some examples, a technique for forming a magnetic tunnel junction includes forming free layer 12 (or composite free layer 12a, 12b, or 12c), fixing layer 14, and further includes forming tunnel barrier 16 on or adjacent free layer 12 (or composite free layer 12a, 12b, or 12c).

In some examples, a technique for forming a spintronic device including STT, SOT, strain or electric-field includes forming free layer 12 (or composite free layer 12a, 12b, or 12c), fixing layer 14, and further includes forming spin channel 42 or multiferroic thin film 30, wherein forming free layer 12 (or composite layer 12a, 12b, or 12c) includes forming free layer 12 on seed layer 35 (or 35a or 35b); and forming tunnel barrier 16 on free layer 12 (or composite free layer 12a, 12b, or 12c).

In some examples, a technique for forming a pure electric-field switching spintronic device including electric-field (voltage) switching includes forming free layer 12 (or composite free layer 12a, 12b, or 12c), and forming fixing layer 14. In some examples, forming free layer 12 (or composite layer 12a, 12b, or 12c) includes forming free layer 12 on seed layer 35 (or 35a or 35b), and forming tunnel barrier 16 on free layer 12 (or composite free layer 12a, 12b, or 12c).

In some examples, a technique includes electric-field tuning of the exchange coupling of SAF structure via transition between ferromagnetic and antiferromagnetic coupling configurations when applying the positive or negative electric field (voltage). In some such examples, parallel and antiparallel states may be obtained for spintronic devices (for example, MTJs), for example, low resistance and high resistance states.

In some examples, a technique for forming a spin-torque-transfer domain wall motion device includes forming free layer 12 (or composite free layer 12a, 12b, or 12c), fixing layer 14. In some examples, an example spin-torque-transfer domain wall motion device may include any article described with reference to FIGS. 1A through 3.

Example articles, structures, or devices according to the disclosure may be operated or used using any suitable technique. Some example techniques are described with reference to example articles described with reference to FIGS. 1A through 3.

Figure 5:
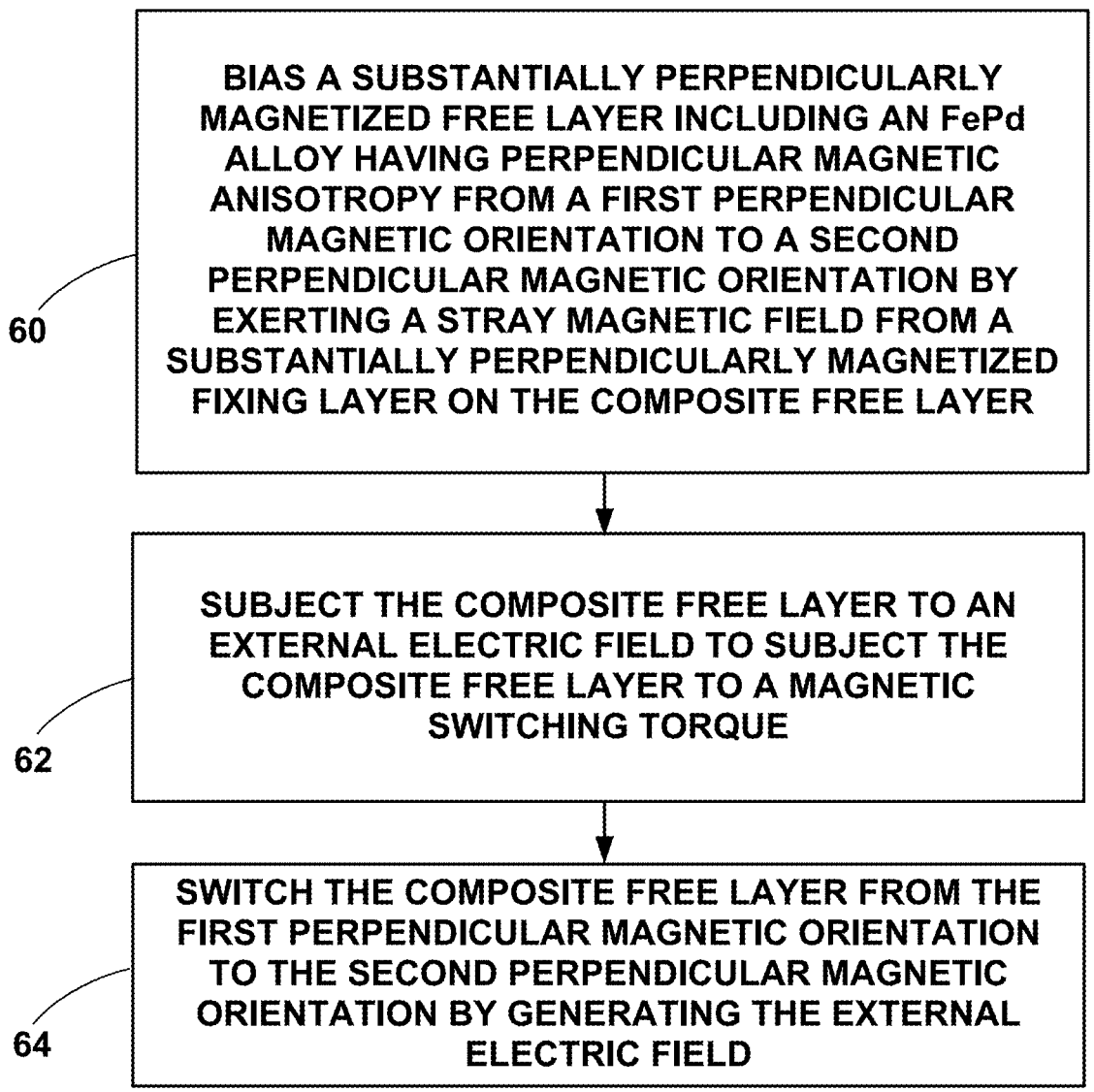
FIG. 5 is a flow diagram illustrating an example technique for switching a substantially perpendicularly magnetized free layer.

FIG. 5 is a flow diagram illustrating an example technique for switching a substantially perpendicularly magnetized free layer. In some examples, the example technique of FIG. 5 includes biasing a substantially perpendicularly magnetized composite free layer (12, 12a, 12b, or 12c) including an FePd alloy having perpendicular magnetic anisotropy from a first perpendicular magnetic orientation to a second perpendicular magnetic orientation that is different than the first perpendicular magnetic orientation by exerting a field (strain, or electric-field) from a substantially perpendicularly magnetized fixing layer (14 or 14a) on the composite free layer (60). The composite free layer has the first perpendicular magnetic orientation in the absence of an applied magnetic field. The example technique includes subjecting the composite free layer to an external electric field (strain) to subject the composite free layer to a magnetic switching torque (62). In some examples, the example technique further includes switching the composite free layer from the first perpendicular magnetic orientation to the second perpendicular magnetic orientation by generating the external electric field (strain) (64).

Figure 6:
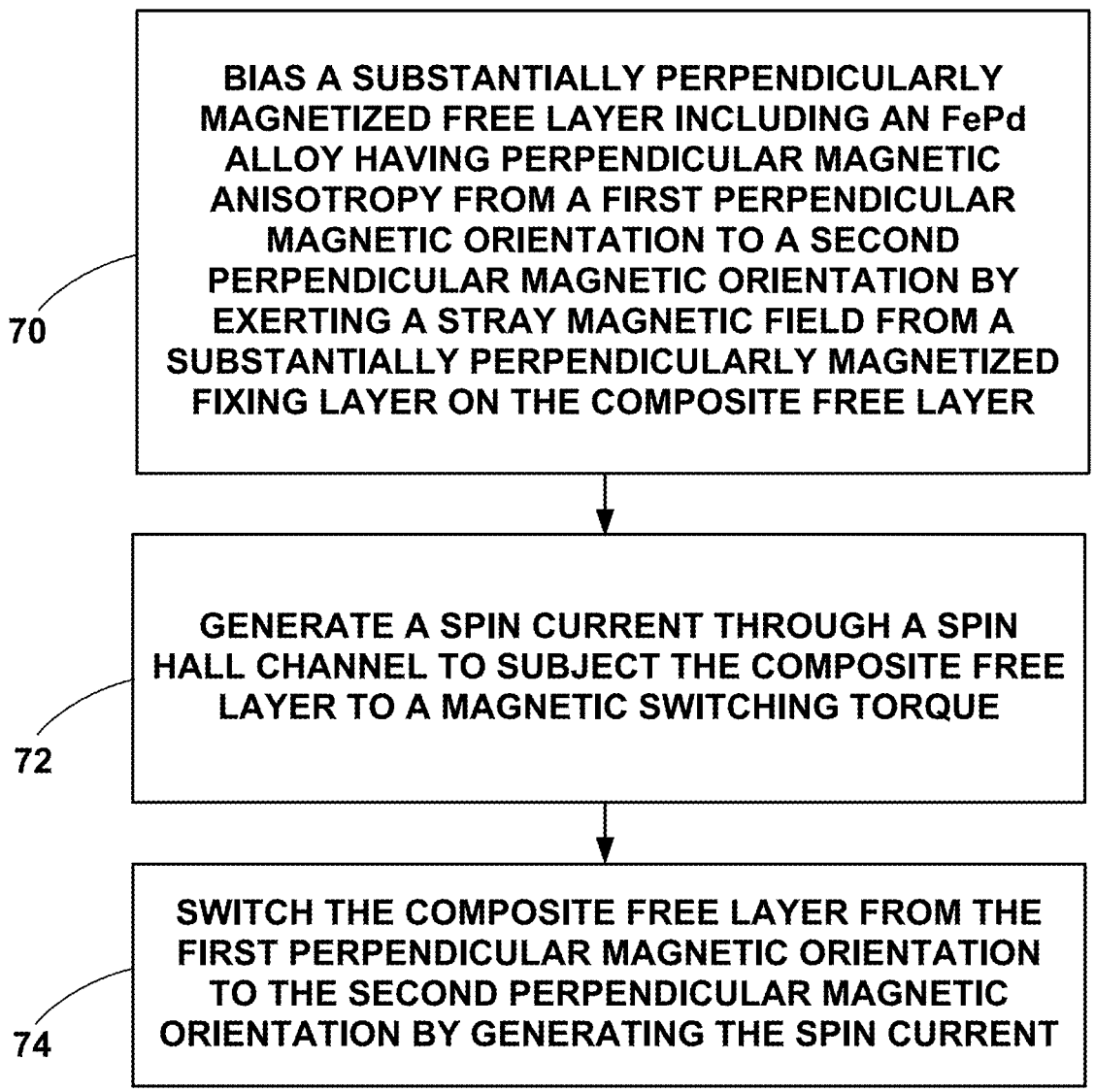
FIG. 6 is a flow diagram illustrating an example technique for switching a substantially perpendicularly magnetized free layer.

FIG. 6 is a flow diagram illustrating an example technique for switching a substantially perpendicularly magnetized free layer. In some examples, the example technique of FIG. 6 includes biasing a substantially perpendicularly magnetized composite free layer (12, 12a, 12b, or 12c) comprising an FePd alloy having perpendicular magnetic anisotropy from a first perpendicular magnetic orientation to a second perpendicular magnetic orientation that is different than the first magnetic orientation by exerting a field (spin current) from a substantially perpendicular magnetized fixing layer (14 or 14a) on the composite free layer (70). The composite free layer has the first perpendicular magnetic orientation in the absence of an applied magnetic field. The example technique includes generating a spin current through a spin Hall channel to subject the composite free layer to a magnetic switching torque (72). In some examples, the example technique further includes switching the composite free layer from the first perpendicular magnetic orientation to the second perpendicular magnetic orientation by generating the spin current (74).

Such switching of magnetic orientation may be used in memory or logic devices, for example, in memory or logic devices including any example article described with reference to FIGS. 1A through 3.

EXAMPLES

Example 1

Thin films were prepared under ultra-high vacuum (base pressure <5.0×10$^{-8}$ Torr) with an eight-target standard magnetron sputtering system and a six-target Shamrock industry-level magnetron sputtering system. All the metal layers were deposited by DC sputtering under a pressure of 2.0 mTorr except FePd layer with 4.5 mTorr and MgO layer was deposited by RF sputtering under a pressure of 1.5 mTorr. The 10.0 nm FePd thin films were prepared at 350° C. with Cr (15.0 nm)/Pt (4.0 nm) seed layer (also as a bottom electrode) which can induce the FePd (001) texture growth. The work Ar gas pressure was ~4.5 mTorr for FePd deposition. The composition of FePd was $Fe_{53.2}Pd_{46.8}$ evaluated using Rutherford backscattering spectrometry (RBS). Then the stack of MgO sub./Cr(15)/Pt(3)/FePd(6)/X/CoFeB (1.3)/MgO (2.0)/Ta (5.0) multilayers (X=Ta and W) (the unit is nanometer) were deposited at RT to study the PMA property of composite layer.

Meanwhile, the stacks of X (0.9)/CoFeB (1.3)/MgO (2.0)/CoFeB (1.3)/Ta (0.7)/[Pd (0.7)/Co (0.3)]$_5$/Pd (5.0)/Ta (5.0) (X=Ta, W) (the unit is nanometers) were grown on 6.0 nm FePd thin films to fabricate the p-MTJ stacks at RT. After that, the p-MTJ stacks were patterned into junctions with diameter ranging from 4 μm to 20 μm by optical lithography and Ar ion milling method. Subsequently, all the thin films and junctions were annealed under 350° C. for 30 mins. The crystalline structures and surface morphology of composite thin films were characterized by X-ray diffraction (XRD) and atomic force microscopy (AFM). Their magnetization curves were measured using Physical Property Measurement System (PPMS). The spin transport properties of the p-MTJs were tested at the different temperatures by four-probe technique using a Dynacool (Quantum Design, San Diego, Calif.) PPMS.

Figure 7A:
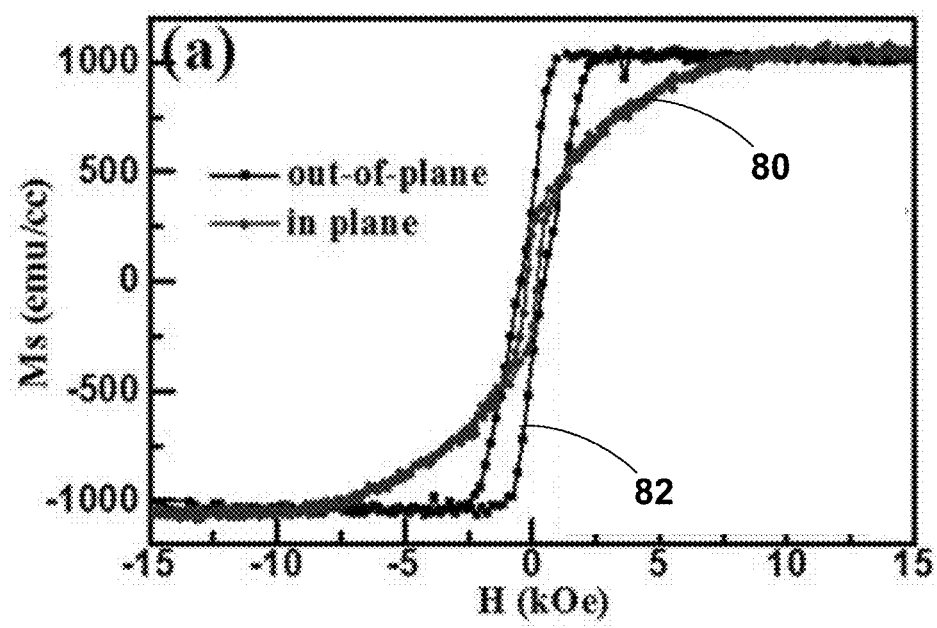
FIG. 7A is a chart illustrating the magnetization hysteresis loops for as-deposited 10 nm FePd thin films.
Figure 7B:
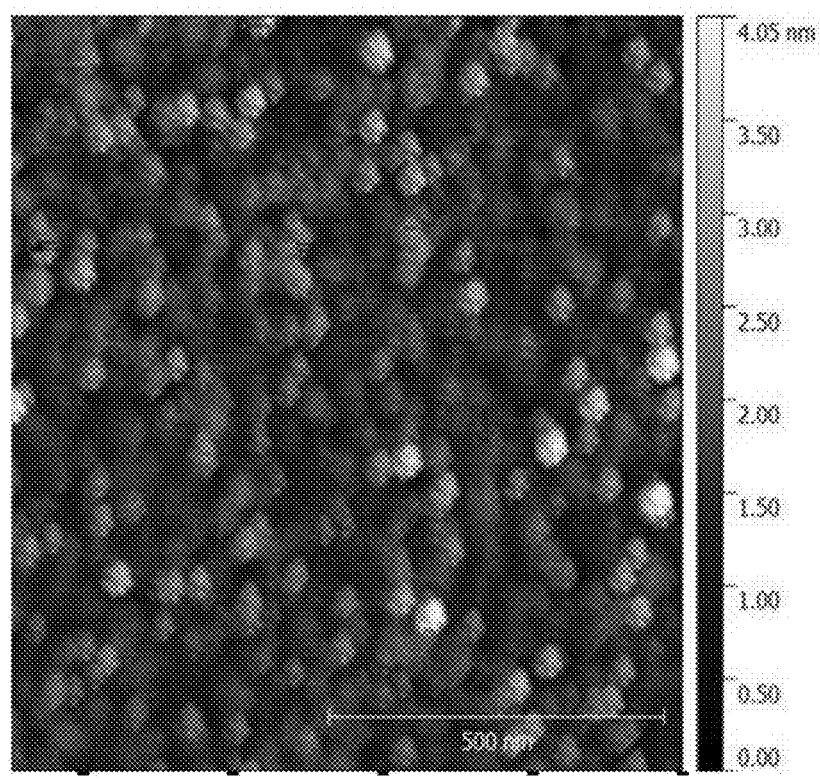
FIG. 7B is a photograph illustrating an atomic force microscopy (AFM) image of the surface of a FePd thin film of FIG. 7A.

FIG. 7A is a chart illustrating the magnetization hysteresis loops for as-deposited 10 nm FePd thin films. Curve 80 is the magnetization hysteresis loop for an example in-plane magnetized thin film. Curve 82 is the magnetization hysteresis loop for an example out-of-plane magnetized thin film. FePd samples with the stacking of Cr (15 nm)/Pt (4 nm)/FePd (6 nm)/Ta (5 nm) deposited on (100) MgO single crystalline substrate. FIG. 7B is a photograph illustrating an atomic force microscopy (AFM) image of the surface of a FePd thin film of FIG. 7A. The PMA property of FePd films was clearly observed. Their saturation magnetization MS is ~1020 emu/cm$^3$, which is close to the value of its bulk material (1100 emu/cm$^3$). Meanwhile, the saturation field $H_K$~10 kOe was obtained from the magnetization curves. The PMA constant $K_u$~11 Merg/cm$^3$ of FePd thin films was evaluated based on its $H_K$ and $M_S$, following the equation $K_u = M_S H_K/2 + 2\pi M_S^2$. FIG. 7B shows a smooth surface of FePd thin films with the roughness ~0.35 nm, which is good for developing the MTJ stacks.

Figure 7C:
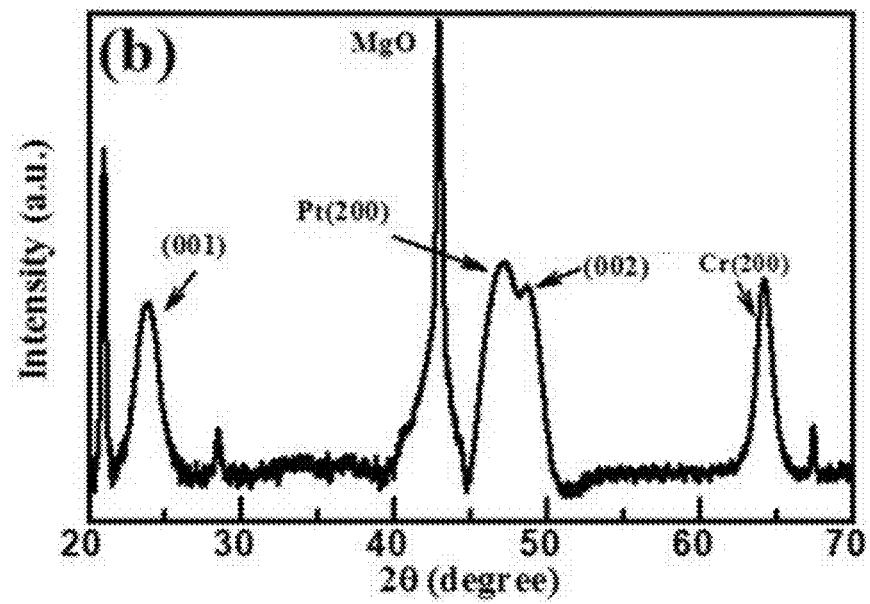
FIG. 7C is a chart illustrating an X-ray diffraction (XRD) pattern of the FePd thin film of FIG. 7A.
Figure 7D:
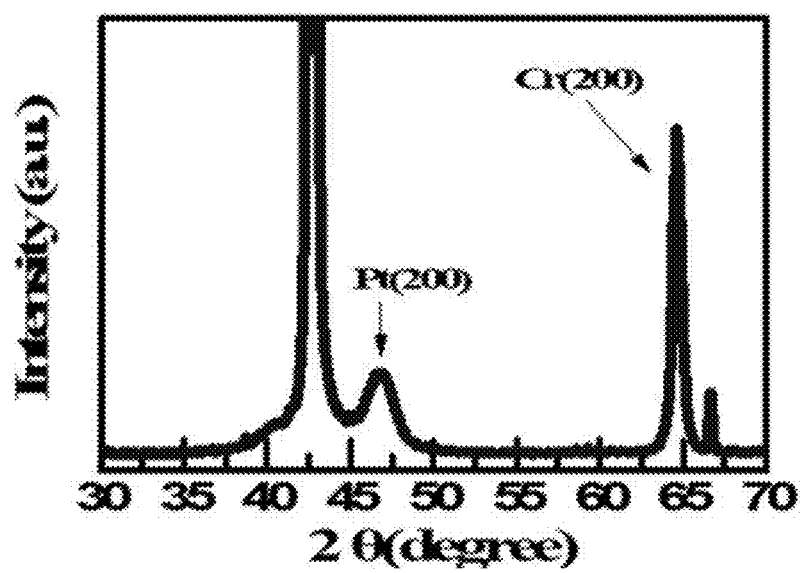
FIG. 7D is a chart illustrating an XRD pattern of a Cr (15 nm)/Pt (4 nm) seed layer on an MgO substrate.

FIG. 7C is a chart illustrating an X-ray diffraction (XRD) pattern of the FePd thin film of FIG. 7A. FIG. 7D is a chart illustrating an XRD pattern of a Cr (15 nm)/Pt (4 nm) seed layer on an MgO substrate. The out-of-plane XRD patterns of the FePd thin film was shown in FIG. 7A. Illustrated are the (001) and (002) peaks of the epitaxy growth of the FePd thin film, indicating that the FePd thin film has a high quality L1$_0$-phase. The (002) peak of the Cr seed layer and (200) peak of the Pt seed layer were observed, indicating that the Cr/Pt seed layer shows good textured growth on the MgO (001) single substrate with heating process, as shown in FIG. 7B.

Example 2

Figure 8A:
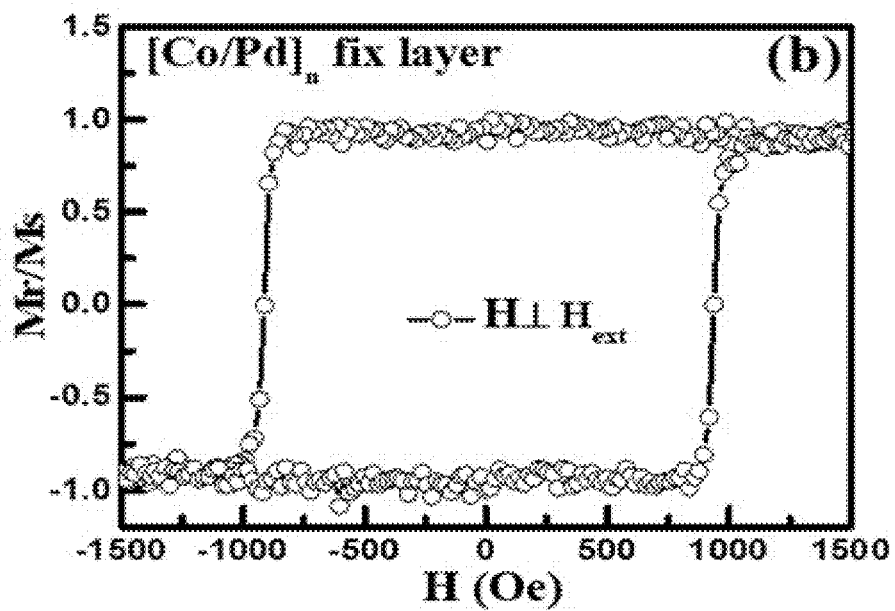
FIG. 8A is a chart illustrating a room temperature out-of-plane magnetization hysteresis curve for an example stack including a [Co/Pd]$_n$/Ta/CoFeB fixing layer.
Figure 8B:
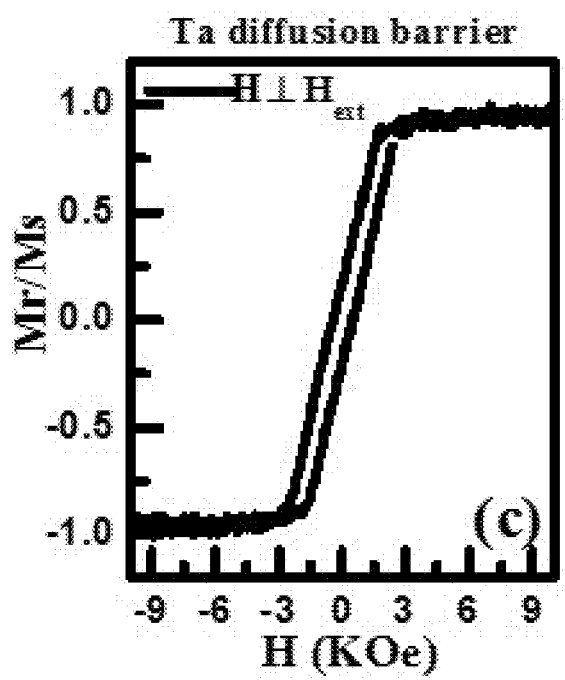
FIG. 8B is a chart illustrating a room temperature out-of-plane magnetization hysteresis curve for a FePd/Ta/CoFeB composite free layer including a tantalum (Ta) diffusion barrier.
Figure 8C:
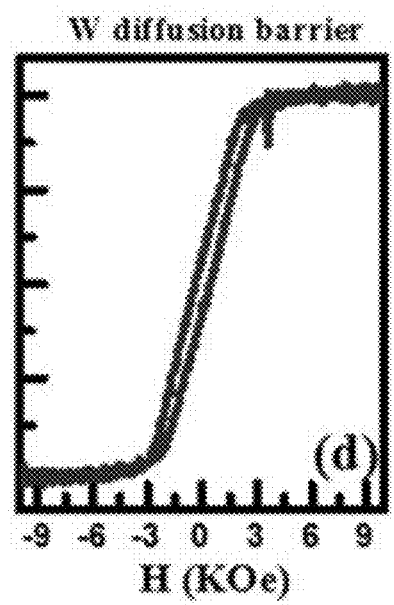
FIG. 8C is a chart illustrating a room temperature out-of-plane magnetization hysteresis curve for the example stack including a FePd/W/CoFeB composite free layer including a tungsten (W) diffusion barrier.

An FePd p-MTJ stack with diffusion barriers, in which the FePd/X/CoFeB (X=Ta, W) as a free layer and [Co/Pd]$_n$/Ta/CoFeB as a fixing layer was prepared. The FePd composite layer is as a bottom free layer and [Co/Pd]n composite layer is as a top fixing layer. Their magnetic property was investigated with high temperature post-annealing. FIG. 8A is a chart illustrating a room temperature out-of-plane magnetization curve (M-H loop) for an example stack including a [Co/Pd]$_n$/Ta/CoFeB fixing layer. FIG. 8B is a chart illustrating a room temperature out-of-plane magnetization hysteresis curve for a FePd/X/CoFeB free layer including a tantalum (Ta) diffusion barrier. Such a structure shows good PMA. FIG. 8C is a chart illustrating a room temperature out-of-plane magnetization hysteresis curve for a FePd/X/CoFeB composite free layer including a tungsten (W) diffusion barrier. Such a structure shows good PMA. FIG. 8A shows the magnetization hysteresis (M-H) loop of the top [Co/Pd]$_n$ composite fixing layer, which exhibited a good perpendicular property with square shape M-H loop and has a large coercivity (Hc) ~1200 Oe after post-annealing at 350° C. with 1 hour. The films were post-annealed at 350° C. with 40 mins. From the M-H loop, it may be perpendicular and couples with CoFeB layer by Ta diffusion barrier.

Example 3

The spin transport properties of the FePd p-MTJ devices were investigated. The ~6.0% RT TMR ratio was obtained in as-deposited micro-size FePd p-MTJs without diffusion barrier. However, these devices were short or showed a very low TMR ratio (<1.0%) after post-annealing at 350° C. One possible reason is the Pd of FePd layer diffused into CoFeB layer or MgO barrier when the devices were post-annealed at high temperature. To possible overcome the Pd diffusion issue, the Ta diffusion barrier layer was introduced into the FePd p-MTJ stacks to block the Pd diffusion and enhance the FePd p-MTJs thermal stability.

FIG. 9A is a chart illustrating magnetoresistance curves of a L1$_0$ FePd/Ta/CoFeB/MgO/CoFeB/Ta/[Co/Pd]$_n$ p-MTJ including a Ta diffusion barrier, at 10 K and 300 K. FIG. 9B is a chart illustrating the temperature dependence of TMR ratio (open stars) in FePd p-MTJs with Ta diffusion barrier. FIG. 9C is a chart illustrating the temperature dependence of resistance of the parallel state (open circles) and the antiparallel state (open stars) in FePd p-MTJs with Ta diffusion barrier. In FIG. 9A, for MR (H) curves of L1$_0$ FePd/Ta/CoFeB/MgO/CoFeB/Ta/[Co/Pd]$_n$ p-MTJs with the Ta diffusion barrier at 10 K (curve 84) and 300 K (curve 86), the junctions were annealed by the rapid thermal anneal (RTA) at 350° C. with 20 mins. For example, FIG. 9A shows the MR ratio as a function of the applied magnetic field (MR-H) for FePd p-MTJs with Ta diffusion barrier. The MR ratios were calculated to be ~8.0% and ~34.8% at 300 K and 10 K, respectively. The temperature dependence of TMR ratios for FePd p-MTJs with Ta diffusion barrier was shown in FIG. 9B. With the decreasing of temperature from 300 K to 10 K, the MR ratios gradually increased up to ~34.8%, which is four times larger than that of RT TMR ratio. Also, the plateau in the high-resistance state was observed at 10 K. FIG. 9C shows the temperature dependence of R of the parallel and antiparallel states for FePd p-MTJs with Ta diffusion barrier post-annealed at 350° C. The R in the parallel state presents a slightly decrease with the temperature increasing. However, the R in the antiparallel state exhibits strong temperature dependence within the range of measurement temperature, which consequently dominates the strong temperature dependence of the TMR ratio.

Figure 10A:
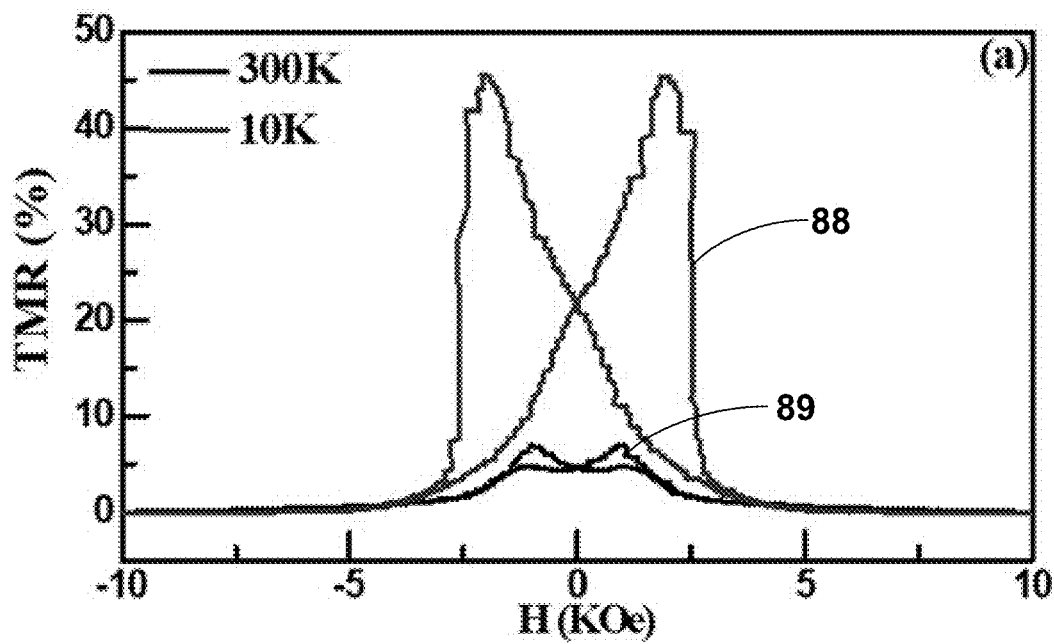
FIG. 10A is a chart illustrating magnetoresistance curves of L1$_0$ FePd/W/CoFeB/MgO/CoFeB/Ta/[Co/Pd]n p-MTJs including a W diffusion barrier, at 10 K and 300 K.
Figure 10A:
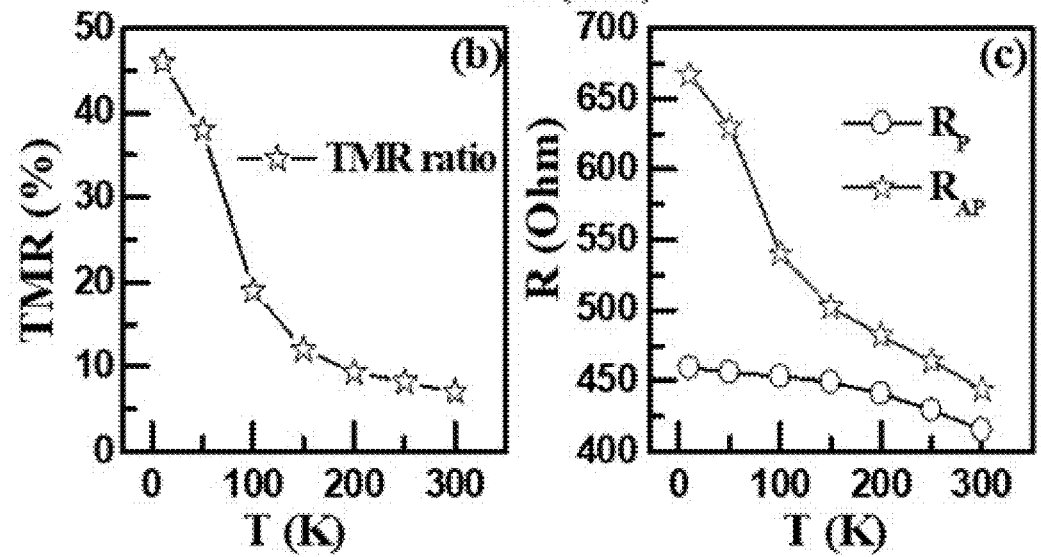

FIG. 10A is a chart illustrating magnetoresistance curves of $L1_0$ FePd/W/CoFeB/MgO/CoFeB/Ta/[Co/Pd]n p-MTJs including a W diffusion barrier, at 10 K and 300 K. FIG. 10B is a chart illustrating the temperature dependence of TMR ratio (open stars) in FePd p-MTJs with W diffusion barrier. FIG. 10C is a chart illustrating the temperature dependence of resistance of the parallel state (open circles) and the antiparallel state (open stars) in FePd p-MTJs with W diffusion barrier. In FIG. 10A, for the MR (H) curves of L10FePd/W/CoFeB/MgO/CoFeB/Ta/[Co/Pd]n p-MTJs with the W diffusion barrier at 10 K (curve 88) and 300 K (curve 89), the junctions were annealed by the rapid thermal anneal (RTA) at 350° C. with 20 mins. FIG. 10A shows the MR ratios as a function of the applied magnetic field (MR-H) for FePd p-MTJs with W diffusion barrier at 300 K and 10 K after post-annealing at 350° C. The TMR ratios are ~7.0% at RT and ~45.8% at 10 K. Upon comparison of the MR-H loop at 300K, when the temperature goes down to 10 K, the MR ratios dramatically increase from ~7% to ~45.8% as shown in FIG. 10B, which is an increase by a factor of 7. In addition, compared with Ta diffusion barrier, the W diffusion barrier may block the Pd diffusion and possibly absorb some B atoms to form WB alloy, meanwhile the W layer has a good thermal stability which is not easy to diffuse into the CoFeB layer or MgO barrier. The temperature dependence of R in the parallel and antiparallel states was plotted, as shown in FIG. 10C. For the R of the parallel state, it shows a slightly decrease but the R of the antiparallel state dramatically decreases with the increase of the temperature.

Example 4

Figure 11A:
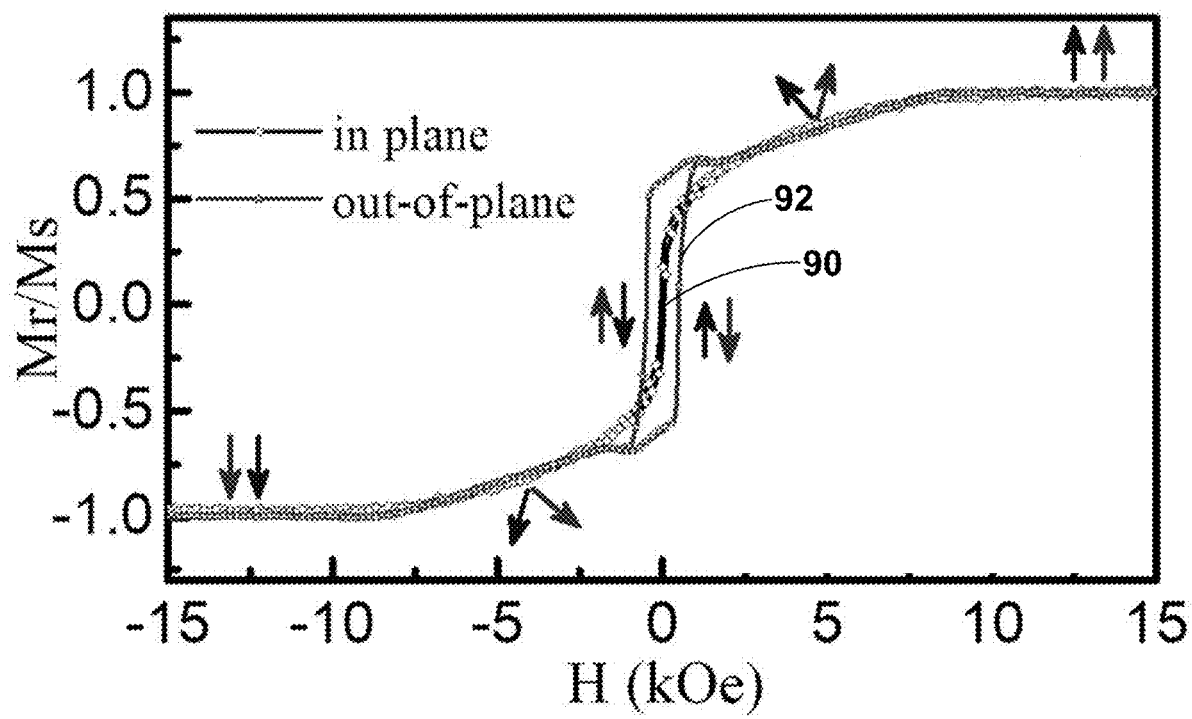
FIG. 11A is a chart illustrating magnetization hysteresis loops of in-plane and out-of-plane of FePd perpendicular synthetic antiferromagnet (p-SAF) stacks.
Figure 11B:
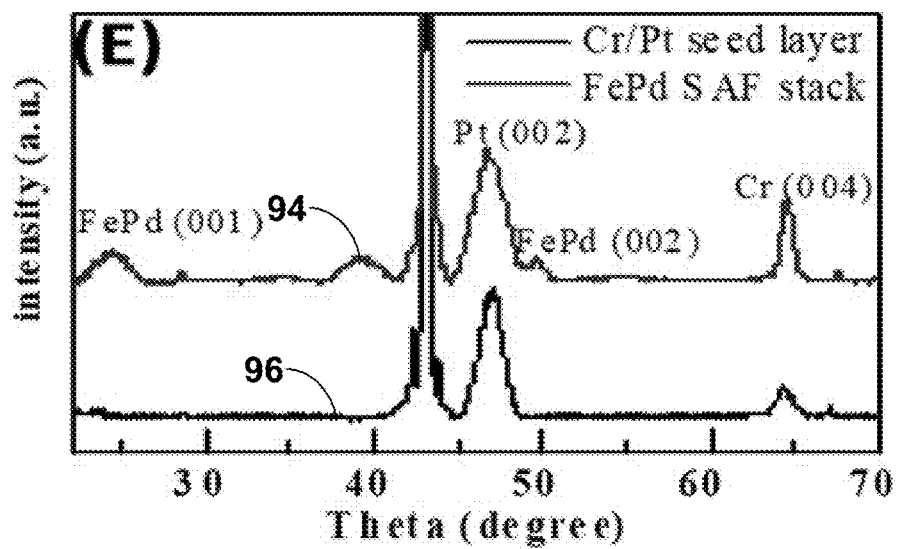
FIG. 11B is a chart illustrating out-of-plane XRD patterns of FePd p-SAF samples with the XRD patterns of the Cr (15 nm)/Pt (4 nm) seed layer on MgO substrate.

A sample FePd p-SAF structure was prepared, in which the Cr and Pt seed layers are used to induce the (001) texture and Ru is as a spacer. FIG. 11A is a chart illustrating magnetization hysteresis loops of in-plane (curve 90) and out-of-plane (curve 92) of FePd perpendicular synthetic antiferromagnet (p-SAF) stacks. FIG. 11B is a chart illustrating out-of-plane XRD patterns of FePd p-SAF samples (curve 94) with the XRD patterns of the Cr (15 nm)/Pt (4 nm) seed layer on MgO substrate (curve 96). The FePd p-SAF layer shows the good perpendicular property with a square shape remnant magnetization loop, as shown in FIG. 11A. The antiferromagnetic coupling strength of two FePd layers was studied by varying the thickness of Ru spacer, and the strongest antiferromagnetic coupling was observed when the thickness of Ru spacer is 1.1 nm which is a little thicker than that of the normal thickness of Ru spacer (0.9 nm) because of the high temperature deposition. For exploring the strain, spin current or electric-field effect, the FePd p-SAF samples with the stack of MgO(001) sub./Cr(15)/Pt (3)/FePd(3)/Ru(x)/FePd(3)/Ta(5) and MgO(001) sub./Cr (15)/Pt(3)/FePd(3)/Ru(x)/FePd(3)/Ta(0.8)/CoFeB(1.3)/ MgO(2)/Ta(5) were patterned into the Hall bars with 2.5 to 20 mm wide and 3 to 200 mm long (thicknesses in nanometers). The coercivity (Hc) and anomalous Hall effect (AHE) of these FePd Hall bar devices were measured with different the voltage by four-probe technical.

Example 5

The FePd SAF p-MTJ stacks were evaluated for the spin transport property, in which the bottom FePd p-SAF layer with the low coercivity and remnant magnetization is as a free layer and the top $[Co/Pd]_n$ multilayer is as a fixed layer. The MTJ stacks were deposited with the structure MgO (001)sub./Cr(15)/Pt(3)/FePd(3)/Ru(x)/FePd(3)/Ta(0.8)/ CoFeB(1.3)/MgO(2)/CoFeB(1.3)/Ta(0.7)/[Pd 0.7/Co0.3]$_5$/ Pd (5)/Ta(5) (thicknesses in nanometers). Subsequently, these FePd SAF p-MTJ stacks were patterned into microsize pillars with the diameter from 400 nm to 12 μm and post-annealed at different temperatures by rapid thermal anneal (RTA). The thermal stability and tunnel magnetoresistance as functions of the post-annealing temperature were investigated.

Example 6

Figure 12A:
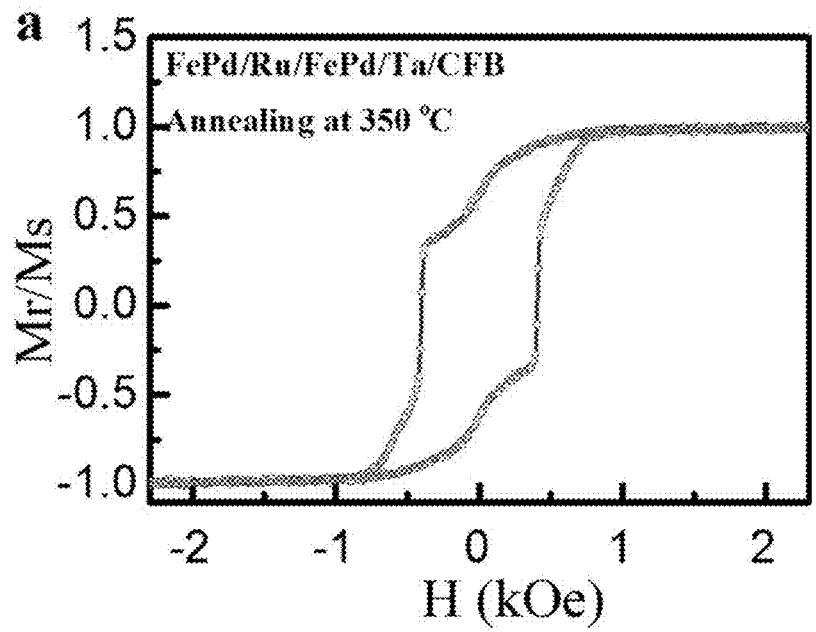
FIG. 12A is a chart illustrating a magnetization hysteresis loop of an example FePd p-SAF composite free layer structure, annealed at 350° C.
Figure 12B:
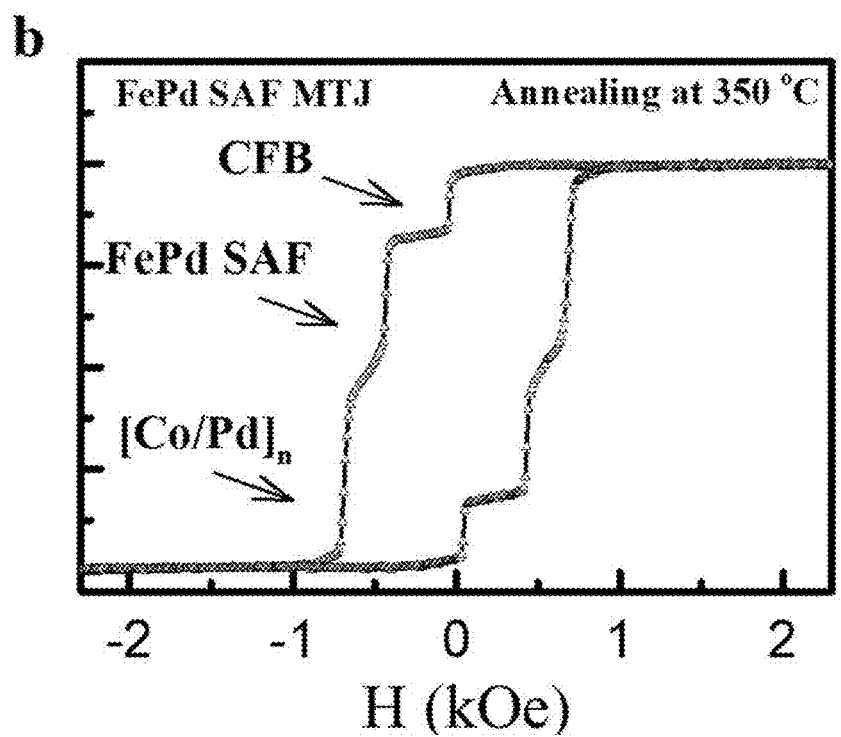
FIG. 12B is a chart illustrating a magnetization hysteresis loop of an example FePd SAF p-MTJ stack including the FePd p-SAF composite free layer structure of FIG. 13A, annealed at 350° C.

Example FePd p-SAF structures were prepared by depositing a structure including CoFeB/Ta/FePd/Ru/FePd. The structures were annealed at 350 and 400° C. FIG. 12A is a chart illustrating a magnetization hysteresis loop of the example FePd p-SAF composite free layer structure, annealed at 350° C. FIG. 12B is a chart illustrating a magnetization hysteresis loop of an example FePd SAF p-MTJ stack including the example FePd SAF composite free layer structure of FIG. 12A as a composite free layer, annealed at 350° C. The example p-MTJ stack included $[Co/Pd]_n$ as a fixing layer.

Figure 13A:
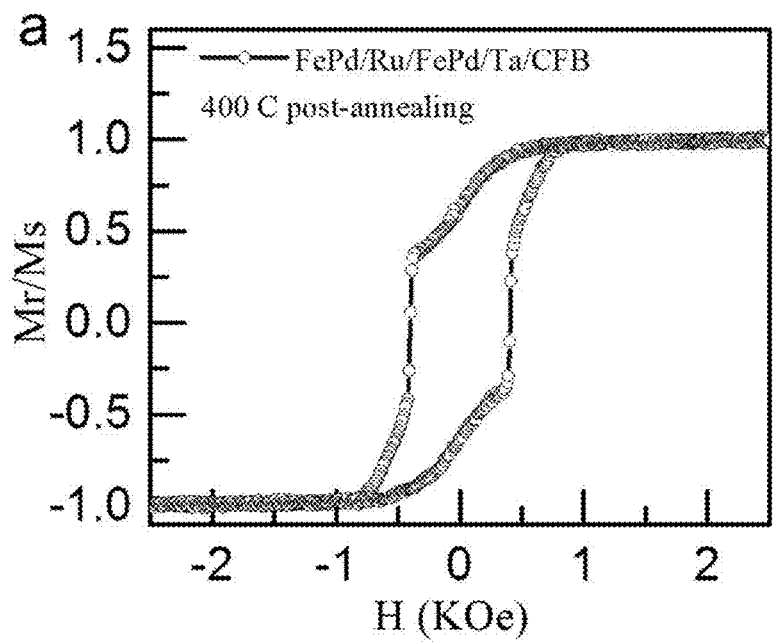
FIG. 13A is a chart illustrating a magnetization hysteresis loop of an example FePd p-SAF composite free layer structure, annealed at 400° C.
Figure 13B:
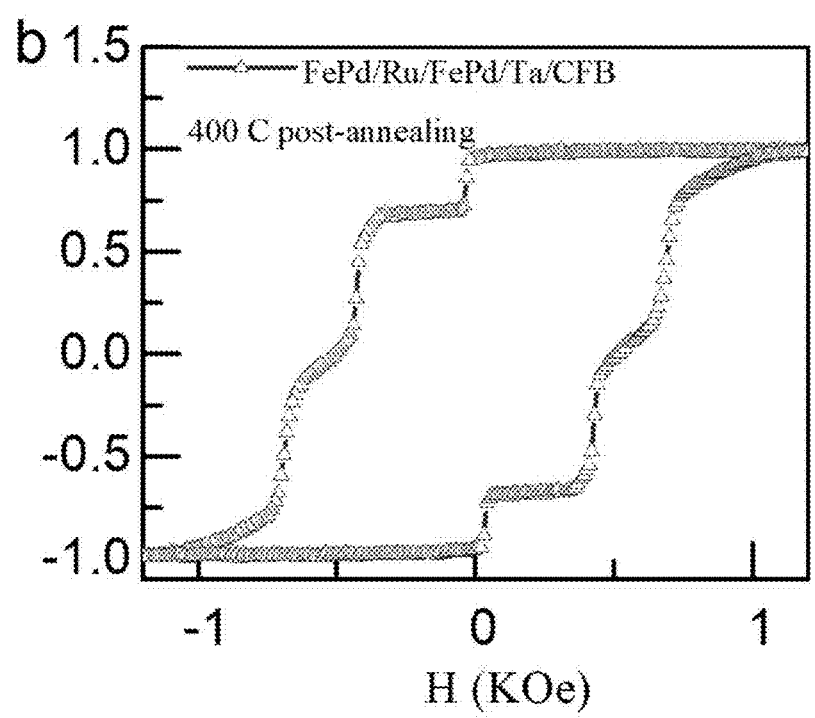
FIG. 13B is a chart illustrating a magnetization hysteresis loop of an example FePd SAF p-MTJ including the FePd p-SAF composite free layer of FIG. 14A, annealed at 400° C.

FIG. 13A is a chart illustrating a magnetization hysteresis loop of an example FePd p-SAF composite free layer structure similar to that of FIG. 12A, annealed at 400° C. FIG. 13B is a chart illustrating a magnetization hysteresis loop of an example FePd SAF p-MTJ stack including the example FePd SAF composite free layer structure of FIG. 13A, annealed at 400° C.

Example 7

Figure 14:
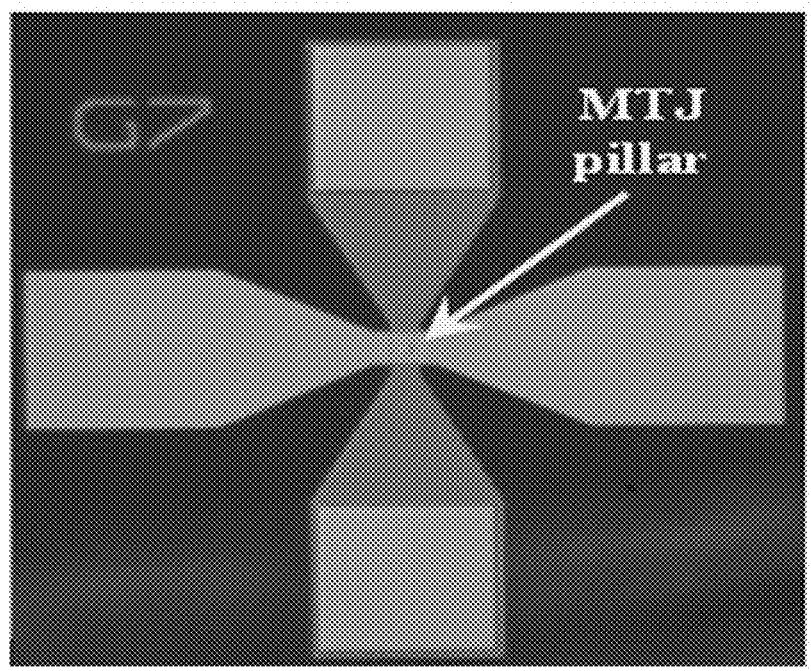
FIG. 14 is a photograph showing an example FePd SAF p-MTJ pillar.
Figures 15A, 15B, 15C, 15D:
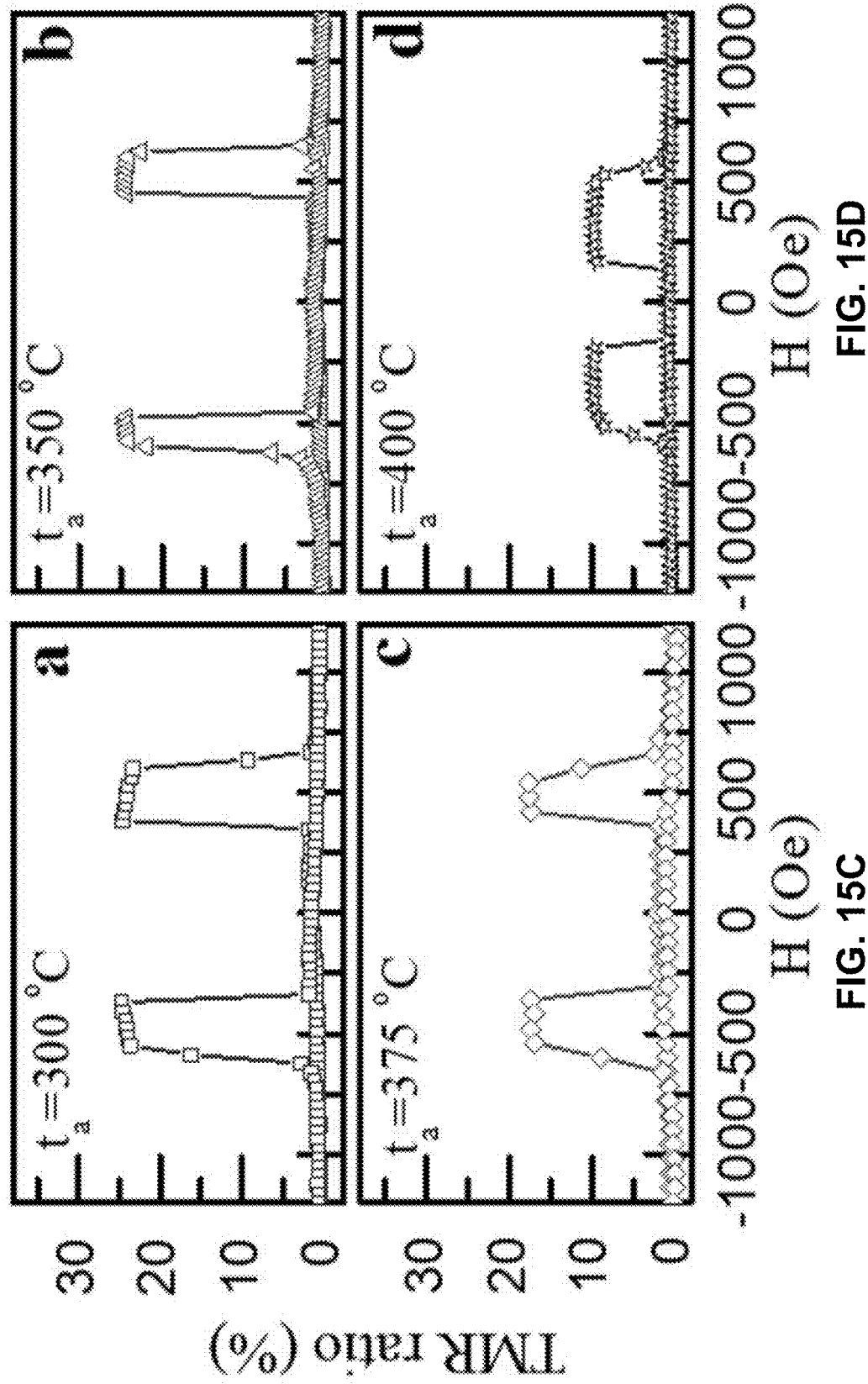
FIGS. 15A to 15D are charts illustrating magnetoresistance curves for annealing temperatures of 300, 350, 375, and 400° C., respectively, for the structure of FIG. 14.
Figure 15E:
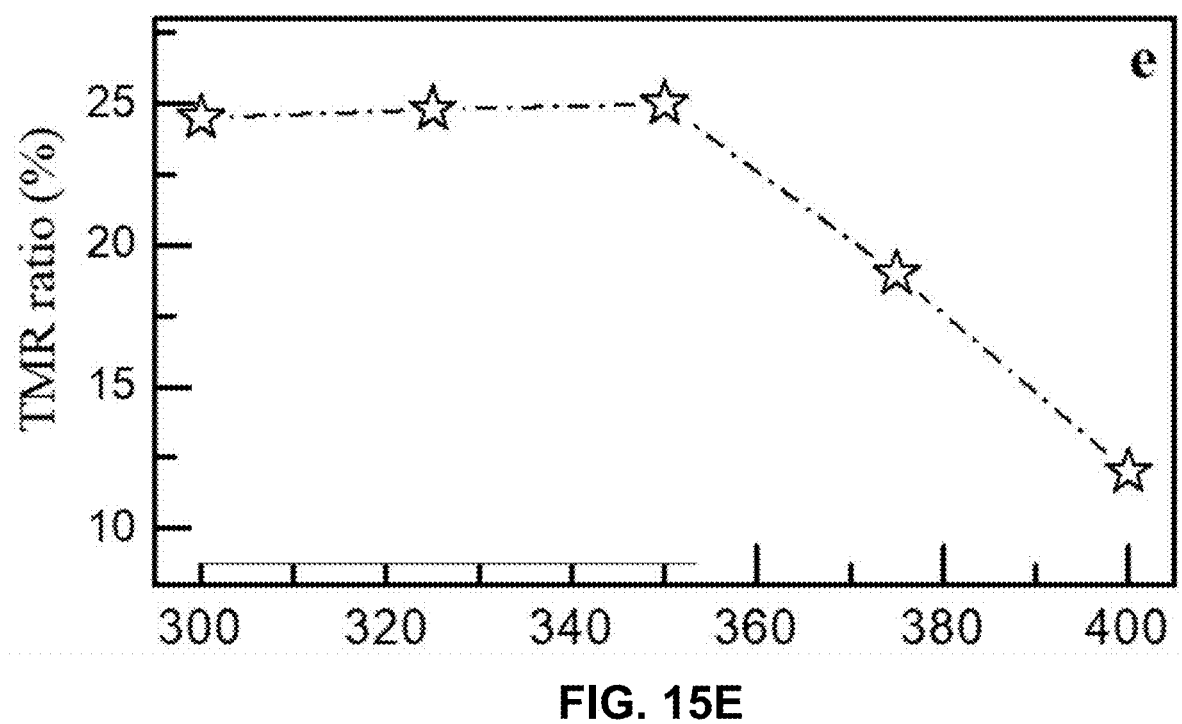
FIG. 15E is a chart illustrating the temperature dependence of TMR ratios for the magnetoresistance curves of FIGS. 15A to 15D.

The MTJ stacks were deposited with the structure MgO (001)sub./Cr(15)/Pt(3)/FePd(3)/Ru(x)/FePd(3)/Ta(0.8)/ CoFeB(1.3)/MgO(2)/CoFeB (1.3)/Ta(0.7)/[Pd 0.7/Co0.3]$_5$/ Pd (5)/Ta(5) (thicknesses in nanometers). Example MTJ pillars were fabricated as shown in FIG. 14, and the magnetoresistance properties of MTJs annealed at different temperatures were evaluated. FIG. 14 is a photograph showing an example FePd SAF p-MTJ pillar. FIGS. 15A to 15D are charts illustrating magnetoresistance curves for annealing temperatures of 300, 350, 375, and 400° C., respectively, for the structure of FIG. 14. FIG. 15E is a chart illustrating the temperature dependence of TMR ratios for the magnetoresistance curves of FIGS. 15A to 15D.

Example 8

Figure 16A:
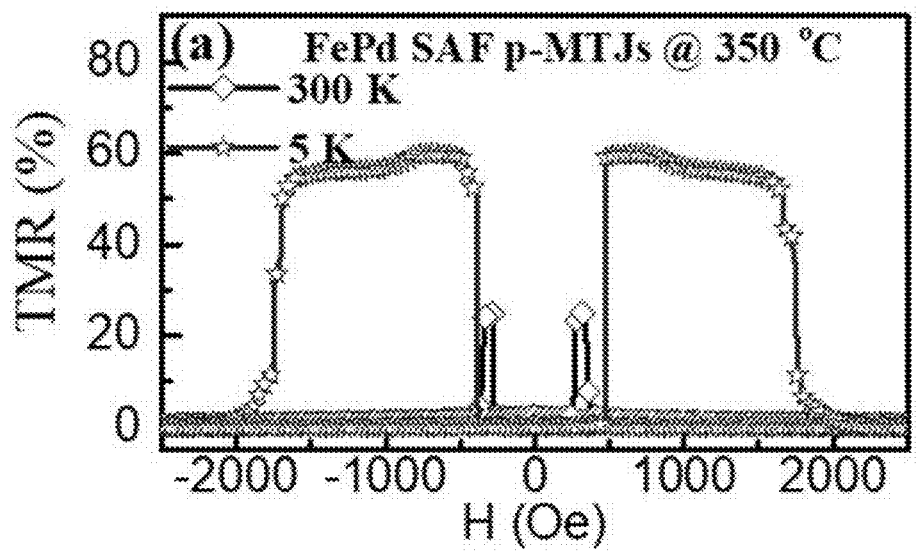
FIGS. 16A and 16B are charts illustrating magnetoresistance curves for FePd SAF p-MTJs annealed at 350 and 400° C., at 5 K and 300 K, respectively.
Figure 16B:
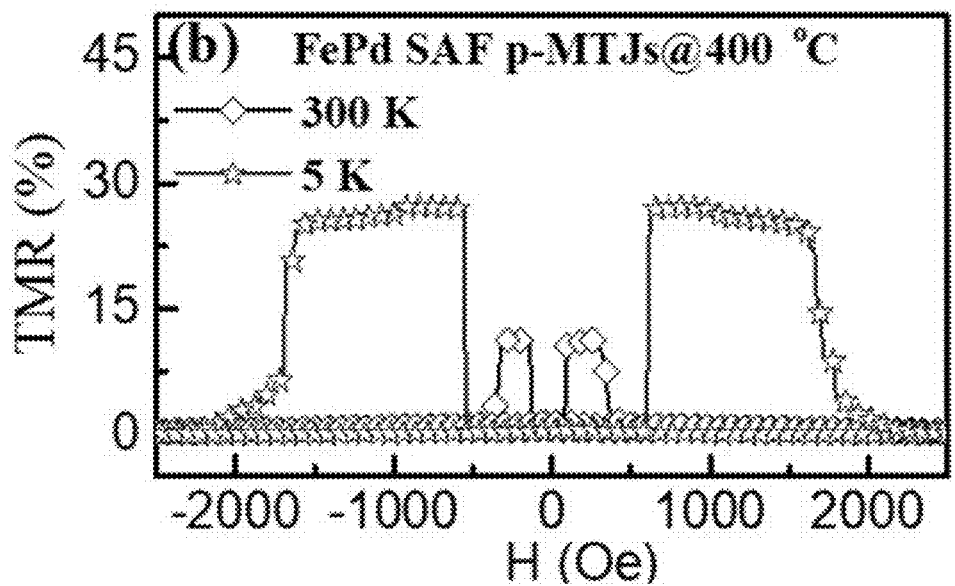
Figure 16C:
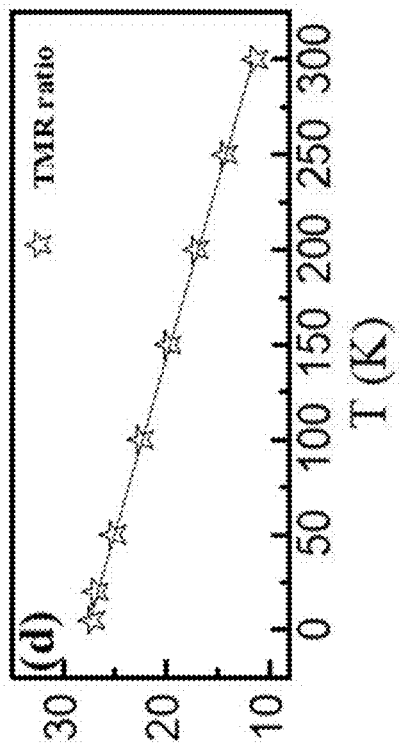
FIGS. 16C and 16D are charts illustrating temperature dependence of TMR ratios for the FePd SAF p-MTJs of FIGS. 16A and 16B, respectively.
Figure 16D:
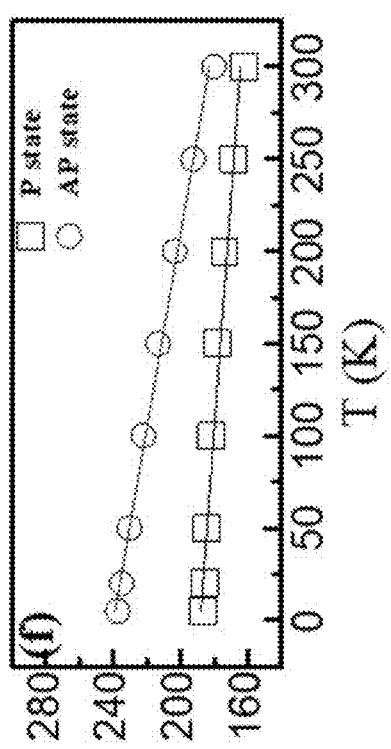
Figure 16E:
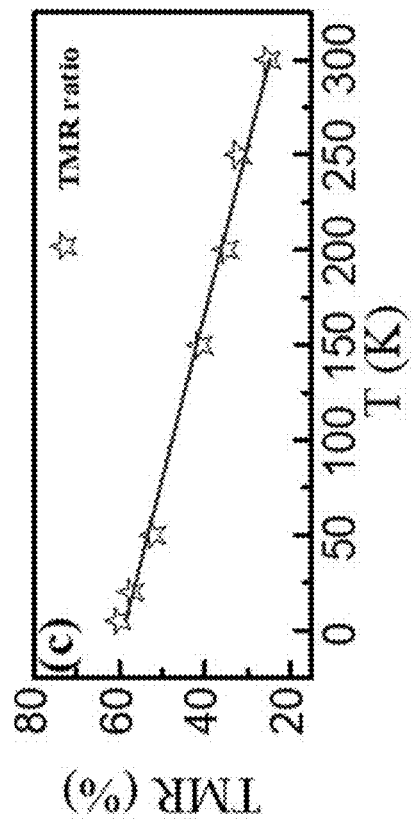
FIGS. 16E and 16F are charts illustrating temperature dependence of resistance for the FePd SAF p-MTJs of FIGS. 16A and 16B, respectively.
Figure 16F:
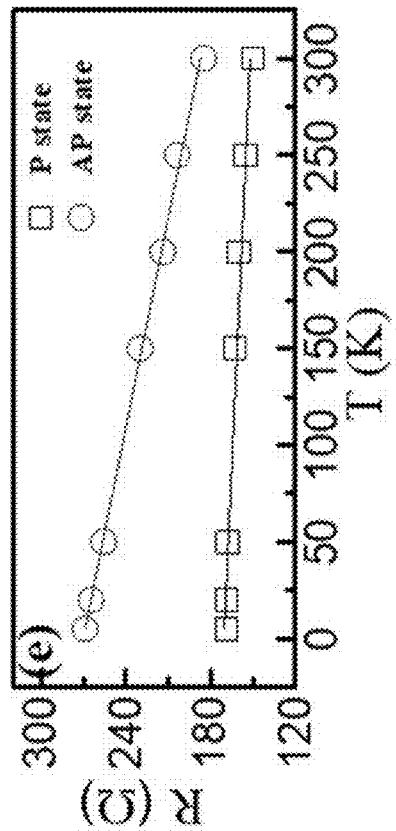
Figure 17:
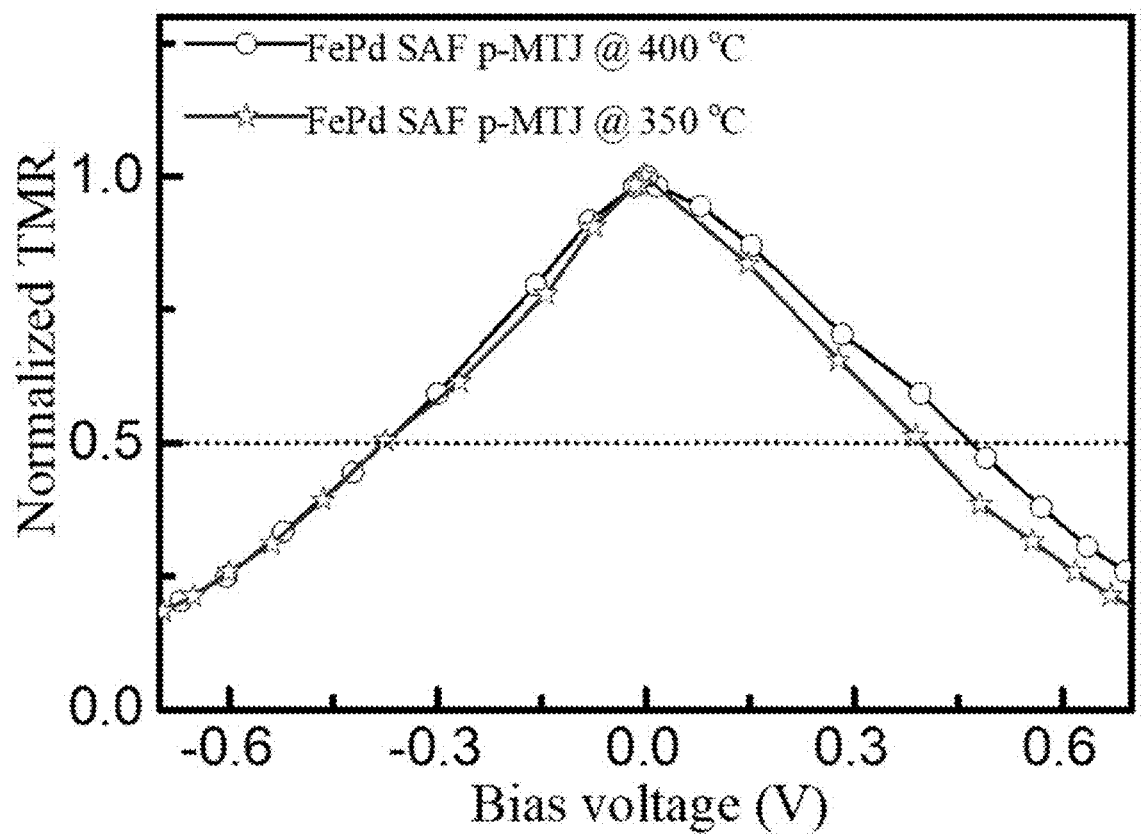
FIG. 17 is a chart illustrating the bias voltage dependence of normalized TMR for the example FePd SAF p-MTJs of FIGS. 16A (stars) and 16B (open circles), respectively.

The MTJ stacks were deposited with the structure MgO (001)sub./Cr(15)/Pt(3)/FePd(3)/Ru(x)/FePd(3)/Ta(0.8)/ CoFeB(1.3)/MgO(2)/CoFeB (1.3)/Ta(0.7)/[Pd 0.7/Co0.3]$_5$/ Pd (5)/Ta(5) (thicknesses in nanometers). Example MTJ pillars were fabricated as shown in FIG. 14, and the magnetoresistance properties of MTJs annealed at different temperatures were evaluated. FIGS. 16A and 16B are charts illustrating magnetoresistance curves for FePd SAF p-MTJs annealed at 350 and 400° C., at 5 K and 300 K, respectively. FIGS. 16C and 16D are charts illustrating temperature dependence of TMR ratios for the FePD SAF p-MTJs of FIGS. 16A and 16B, respectively. FIGS. 16E and 16F are charts illustrating temperature dependence of resistance for the FePd SAF p-MTJs of FIGS. 16A and 16B, respectively. FIG. 17 is a chart illustrating the bias voltage dependence of normalized TMR for the example FePd SAF p-MTJs of FIGS. 16A (stars) and 16B (open circles), respectively.

Example 9

Figure 18A:
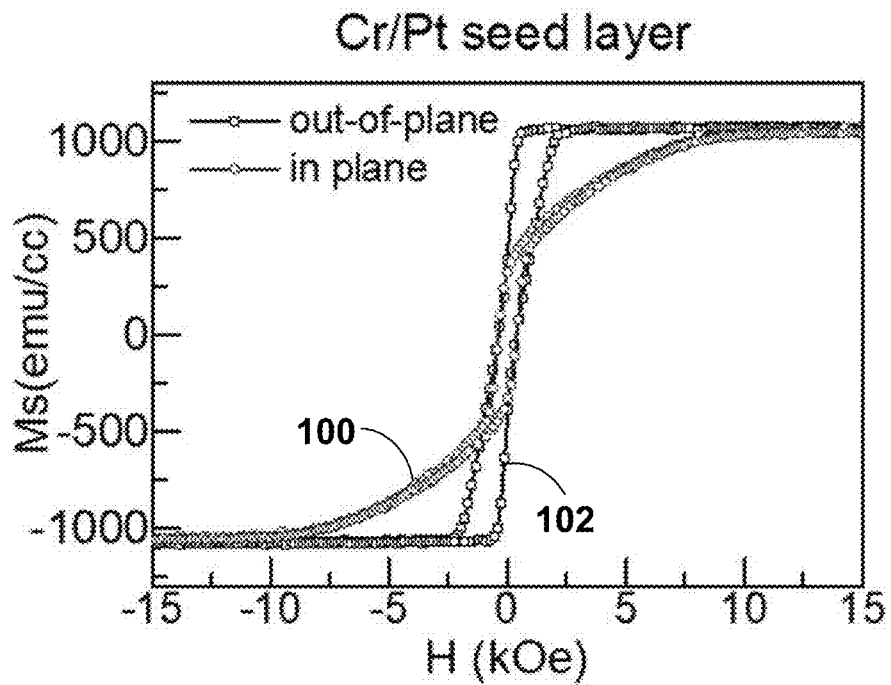
FIG. 18A is a chart illustrating in-plane and out-of-plane magnetization hysteresis loops of an example FePd PMA stack including a Cr/Pt seed layer.
Figure 18B:
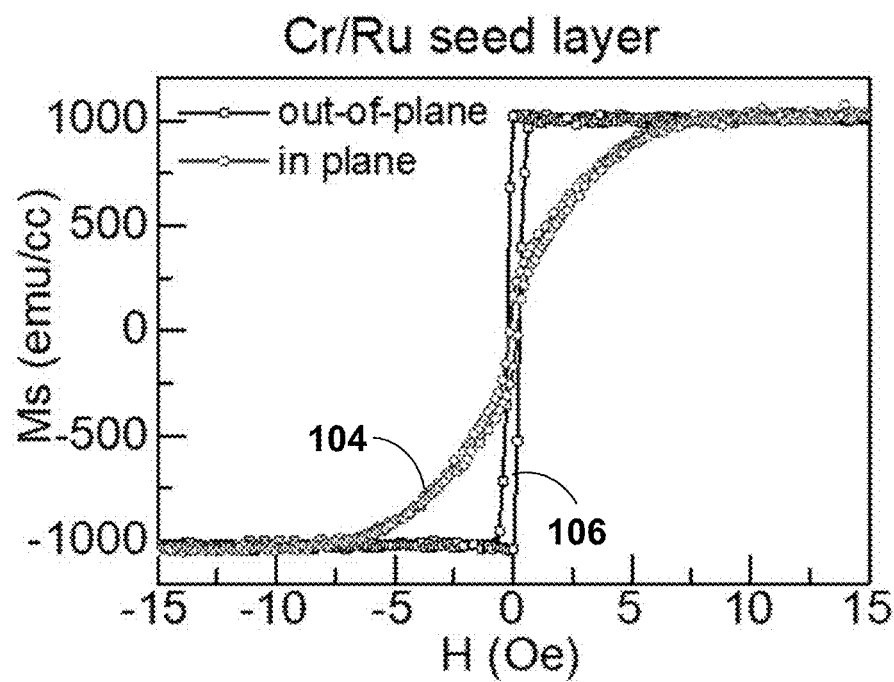
FIG. 18B is a chart illustrating in-plane and out-of-plane magnetization hysteresis loops of an example FePd PMA stack including a Cr/Ru seed layer.

Stacks were deposited with the structure MgO(001)sub./Cr(15)/X(3)/FePd(7)/Ta(5) (X=Pt, or Ru) (thicknesses in nanometers). PMA was induced in example magnetic structures including FePd using seed layers including Cr/Pt or Cr/Ru. FIG. 18A is a chart illustrating in-plane (curve 100) and out-of-plane (curve 102) magnetization hysteresis loops of an example FePd PMA stack including a Cr/Pt seed layer. FIG. 18B is a chart illustrating in-plane (curve 104) and out-of-plane (curve 106) magnetization hysteresis loops of an example FePd PMA stack including a Cr/Ru seed layer.

Example 10

Figure 19:
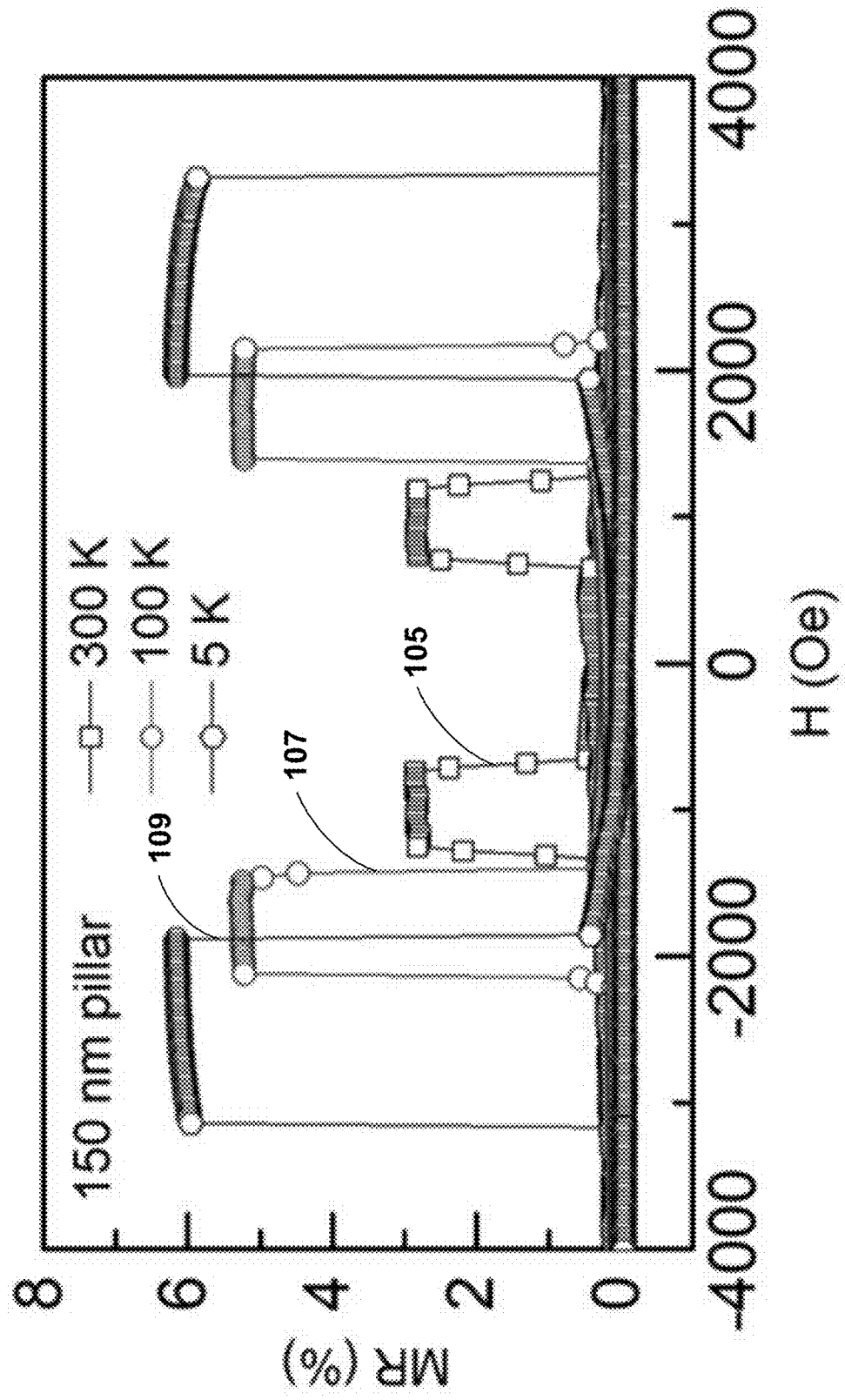
FIG. 19 is a chart illustrating magnetoresistance curves for 150 nm pillar of FePd SAF p-MTJ stacks of FIG. 12B at different temperatures.
Figure 20A:
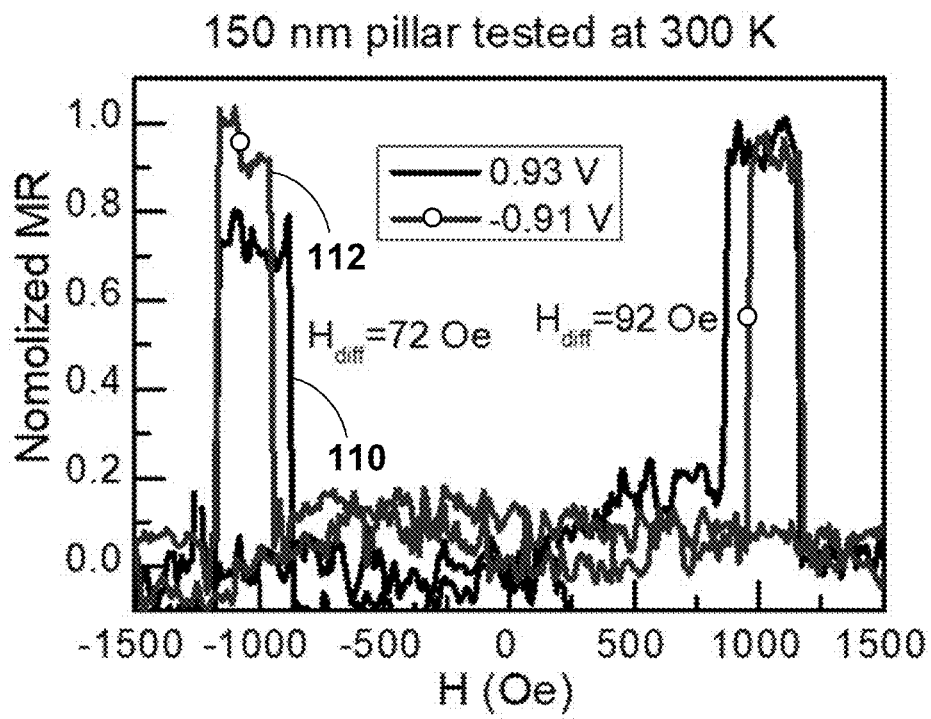
FIGS. 20A to 20C are charts illustrating magnetoresistance curves for a 150 nm pillar FePd SAF p-MTJ stack with the positive and negative voltages at 300 K, 10 K, and 5 K, respectively.
Figure 20B:
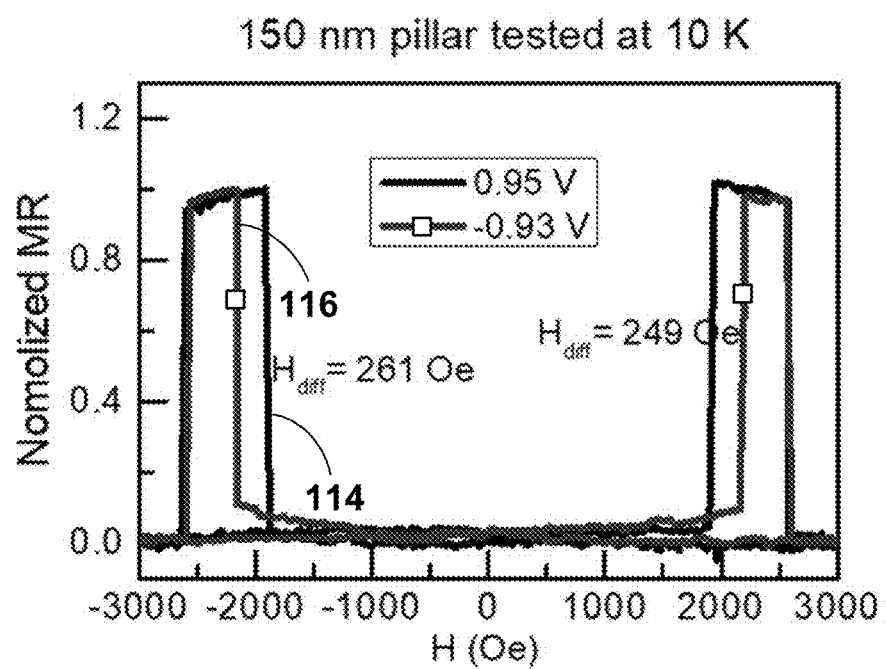
Figure 20C:
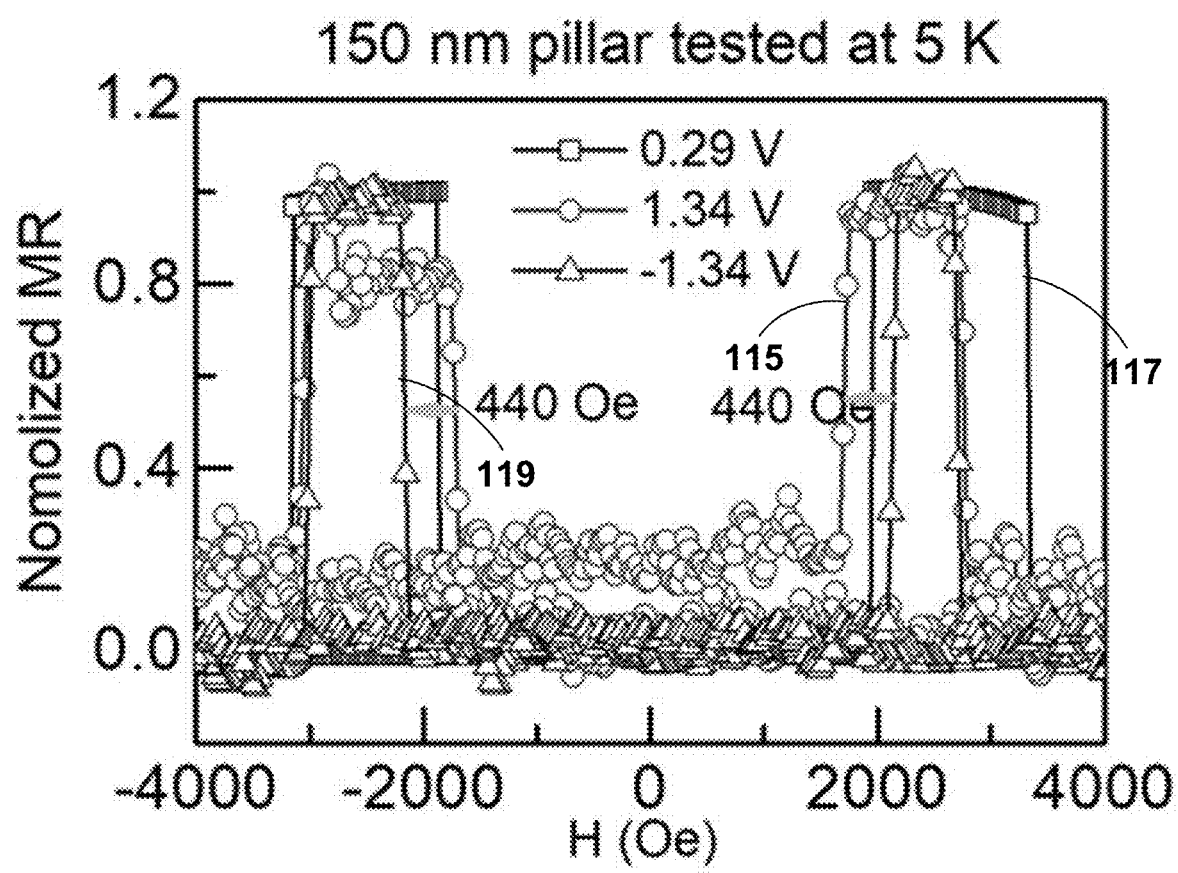

MTJ stacks were deposited with the structure MgO(001)sub./Cr(15)/Pt(3)/FePd(3)/Ru(x)/FePd(3)/Ta(0.8)/CoFeB (1.3)/MgO(2)/CoFeB(1.3)/Ta(0.7)/[Pd 0.7/Co0.3]$_5$/Pd (5)/Ta(5) (thicknesses in nanometers). Nano-sized FePd SAF p-MTJ devices were fabricated. 150 nm pillars of FePd SAF p-MTJ devices were patterned by e-beam method. FIG. 19 is a chart illustrating magnetoresistance curves for 150 nm pillar of FePd SAF p-MTJ stacks of FIG. 12B at different temperatures (curve 105 at 300 K, curve 107 at 100 K, and curve 109 at 5 K). FIGS. 20A to 20C are charts illustrating the magnetoresistance curves depended on the negative and positive electric field for a 150 nm pillar FePd SAF p-MTJ stack with positive and negative voltages at 300, 10, and 5 K, respectively. In FIG. 20A, at 300 K, curve 110 is the magnetoresistance curve at 0.93 V, while curve 112 is the magnetoresistance curve at −0.91 V. In FIG. 20B, at 10 K, curve 114 is the magnetoresistance curve at 0.95 V, while curve 116 is the magnetoresistance curve at −0.93 V. In FIG. 20C, at 5 K, curve 115 is the magnetoresistance curve at 1.34 V, curve 117 is the magnetoresistance curve at 0.29 V, while curve 119 is the magnetoresistance curve at −1.34 V.

Various examples have been described. These and other examples are within the scope of the following claims.

What is claimed is:

1. An article comprising:
    at least one multiferroic substrate; and
    a perpendicular magnetic tunnel junction on the at least one multiferroic substrate, wherein the perpendicular magnetic tunnel junction comprises:
        a fixing layer;
        a composite free layer comprising a first layer comprising a FePd alloy, the FePd alloy having perpendicular magnetic anisotropy; and
        a tunnel barrier layer between the composite free layer and the fixing layer, wherein the composite free layer is between the at least one multiferroic substrate and the tunnel barrier layer.

2. The article of claim 1, wherein the composite free layer further comprises a second layer comprising at least one of a CoFeB alloy and a Heusler alloy.

3. The article of claim 2, wherein the second layer comprises a half-metallic Heusler alloy.

4. The article of claim 2, wherein the composite free layer further comprises a diffusion barrier layer between the first layer and the second layer.

5. The article of claim 4, wherein the diffusion barrier layer comprises at least one of V, Cr, Ru, Ta, TaN, TiN, W, Mo, and Ir.

6. The article of claim 4, wherein the diffusion barrier layer defines a thickness of between about 0.3 nm and about 5 nm.

7. The article of claim 4, wherein the composite free layer further comprises:
    a third layer including the FePd alloy; and
    a spacer layer between the first layer and the third layer, wherein the first layer is between the diffusion barrier layer and the third layer.

8. The article of claim 1, wherein the composite free layer comprises a plurality of magnetic layers interleaved with a plurality of spacer layers, wherein each magnetic layer of the plurality of magnetic layers includes the FePd alloy having perpendicular magnetic anisotropy, wherein at least one FePd layer comprises the first layer.

9. The article of claim 8, wherein each spacer layer of the plurality of spacer layers comprises at least one of V, Cr, Ru, Ta, W, and Mo.

10. The article of claim 8, wherein each spacer layer of the plurality of spacer layers defines a thickness between about 0.3 nm and about 1.6 nm.

11. The article of claim 8, wherein the composite free layer comprises a perpendicular synthetic antiferromagnetic (p-SAF) structure.

12. The article of claim 1, further comprising a composite seed layer comprising at least one of:
    alternating layers of a first seed layer and a second seed layer, wherein the first seed layer comprises one of Cr or CrRu, and wherein the second seed layer comprises one of Pt or Pd; and
    alternating layers of the first seed layer, the second seed layer, and a third seed layer, wherein the third seed layer comprises the other of Pt or Pd not included in the second seed layer.

13. The article of claim 1, wherein the FePd alloy comprises an L1$_0$-phase FePd alloy.

14. The article of claim 1, further comprising a seed layer comprising a first seed layer comprising Cr and a second seed layer comprising Pt, wherein the tunnel barrier layer comprises MgO and the fixing layer comprises a first fixing layer comprising a CoFeB alloy, a second fixing layer comprising Ta, and a third fixing layer comprising a CoPd alloy, and wherein the second fixing layer is between the first fixing layer and the third fixing layer.

15. The article of claim 1, further comprising a at least one multiferroic thin film, wherein the at least one multiferroic thin film is between the composite free layer and the multiferroic substrate.

16. The article of claim 15, wherein the multiferroic substrate comprises at least one of BiFeO$_3$ and BaTiO$_3$, wherein the at least one multiferroic thin film comprises at least one of BiFeO$_3$ and BaTiO$_3$, the tunnel barrier layer comprises MgO, and the fixing layer comprises a first fixing layer comprising a CoFeB alloy, a second fixing layer comprising Ta, and a third fixing layer a CoPd alloy, and wherein the second fixing layer is between the first fixing layer and the third fixing layer.

17. A method comprising:
    forming a perpendicular magnetic tunnel junction on a multiferroic substrate, wherein forming the perpendicular magnetic tunnel junction comprises:
        forming a composite free layer by forming a first layer comprising a FePd alloy, the FePd alloy having perpendicular magnetic anisotropy;
        forming a tunnel barrier layer adjacent the composite free layer; and forming a fixing layer adjacent the tunnel barrier layer, wherein the composite free layer is between the at least one multiferroic substrate and the tunnel barrier layer.

18. The method of claim 17, wherein forming the perpendicular magnetic tunnel junction further comprises forming a diffusion barrier layer on the free layer.

19. The method of claim 17, wherein forming the composite free layer further comprises forming a second layer of the composite free layer, the second layer comprising at least one of a CoFeB alloy and a Heusler alloy.

20. The method of claim 19, wherein forming the composite free layer further comprises:
forming a spacer layer on the first layer; and
forming a third layer including the FePd alloy on the spacer layer.

21. The method of claim 17, wherein forming the composite free layer comprises forming a plurality of FePd layers interleaved with a plurality of spacer layers, wherein each FePd layer of the plurality of FePd layers includes the FePd alloy having perpendicular magnetic anisotropy.

22. The method of claim 17, further comprising forming a seed layer on the multiferroic substrate, wherein forming the composite free layer comprises forming the composite free layer on the seed layer.

23. A method comprising:
biasing a substantially perpendicularly magnetized composite free layer comprising an FePd alloy having perpendicular magnetic anisotropy from a first perpendicular magnetic orientation to a second perpendicular magnetic orientation that is different from the first perpendicular magnetic orientation by exerting a field from a substantially perpendicularly magnetized fixing layer adjacent the composite free layer, wherein the composite free layer has the first perpendicular magnetic orientation in the absence of an applied magnetic field, wherein a perpendicular magnetic tunnel junction comprises the substantially perpendicularly magnetized composite free layer, the substantially perpendicularly magnetized fixing layer, and a tunnel barrier layer between on the substantially perpendicularly magnetized composite free layer and the substantially perpendicularly magnetized fixing layer, and wherein the perpendicular magnetic tunnel junction is on a multiferroic substrate such that the substantially perpendicularly composite free layer is between the at least one multiferroic substrate and the tunnel barrier layer; and
subjecting the substantially perpendicularly magnetized composite free layer to an external field to subject the substantially perpendicularly magnetized composite free layer to a magnetic switching torque.

24. The method of claim 23, wherein the external field causes the substantially perpendicularly magnetized composite free layer to switch from the first perpendicular magnetic orientation to the second perpendicular magnetic orientation.

* * * * *